US011069795B2

(12) United States Patent
Jambunathan et al.

(10) Patent No.: US 11,069,795 B2
(45) Date of Patent: Jul. 20, 2021

(54) TRANSISTORS WITH CHANNEL AND SUB-CHANNEL REGIONS WITH DISTINCT COMPOSITIONS AND DIMENSIONS

(71) Applicant: INTEL CORPORATION, Santa Clara, CA (US)

(72) Inventors: Karthik Jambunathan, Hillsboro, OR (US); Glenn A. Glass, Portland, OR (US); Anand S. Murthy, Portland, OR (US); Jun Sung Kang, Portland, OR (US); Bruce E. Beattie, Portland, OR (US); Anupama Bowonder, Portland, OR (US); Biswajeet Guha, Hillsboro, OR (US); Ju H. Nam, Hillsboro, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/636,206

(22) PCT Filed: Sep. 28, 2017

(86) PCT No.: PCT/US2017/054034
§ 371 (c)(1),
(2) Date: Feb. 3, 2020

(87) PCT Pub. No.: WO2019/066857
PCT Pub. Date: Apr. 4, 2019

(65) Prior Publication Data
US 2020/0411513 A1 Dec. 31, 2020

(51) Int. Cl.
*H01L 21/8234* (2006.01)
*H01L 27/088* (2006.01)
(Continued)

(52) U.S. Cl.
CPC .......... *H01L 29/66818* (2013.01); *H01L 21/823431* (2013.01); *H01L 27/0886* (2013.01);
(Continued)

(58) Field of Classification Search
CPC .......... H01L 27/0886; H01L 27/1211; H01L 29/41791; H01L 29/78696;
(Continued)

(56) References Cited

U.S. PATENT DOCUMENTS

| 9,954,104 B2* | 4/2018 | Xie ............... H01L 21/823821 |
| 2013/0105867 A1* | 5/2013 | Wang .............. H01L 29/0649 |
| | | 257/288 |

(Continued)

FOREIGN PATENT DOCUMENTS

| KR | 20130107136 A | 10/2013 |
| WO | 2019066857 A1 | 4/2019 |

OTHER PUBLICATIONS

International Preliminary Report on Patentability received for PCT Application No. PCT/US2017/054034. dated Apr. 9, 2020 6 pages.
(Continued)

*Primary Examiner* — Errol V Fernandes
*Assistant Examiner* — Jeremy J Joy
(74) *Attorney, Agent, or Firm* — Schwabe, Williamson & Wyatt, P.C.

(57) ABSTRACT

Integrated circuits include fins including an upper/channel region and a lower/sub-channel region, the lower region having a first chemical composition and opposing sidewalls adjacent to an insulator material, and the upper region having a second chemical composition. A first width indicates the distance between the opposing sidewalls of the lower region at a first location is at least 1 nm wider than a second width indicating the distance between the opposing
(Continued)

sidewalls of the upper region at a second location, the first location being within 10 nm of the second location (or otherwise relatively close to one another). The first chemical composition is distinct from the second chemical composition and includes a surface chemical composition at an outer surface of the opposing sidewalls of the lower region and a bulk chemical composition therebetween, the surface chemical composition including one or more of oxygen, nitrogen, carbon, chlorine, fluorine, and sulfur.

20 Claims, 8 Drawing Sheets

(51) Int. Cl.
    *H01L 27/092* (2006.01)
    *H01L 29/06* (2006.01)
    *H01L 29/417* (2006.01)
    *H01L 29/423* (2006.01)
    *H01L 29/66* (2006.01)
    *H01L 29/775* (2006.01)
    *H01L 29/78* (2006.01)
    *H01L 29/786* (2006.01)

(52) U.S. Cl.
    CPC ...... *H01L 27/0924* (2013.01); *H01L 29/0669* (2013.01); *H01L 29/0673* (2013.01); *H01L 29/41791* (2013.01); *H01L 29/42392* (2013.01); *H01L 29/66439* (2013.01); *H01L 29/66545* (2013.01); *H01L 29/775* (2013.01); *H01L 29/785* (2013.01); *H01L 29/78696* (2013.01)

(58) Field of Classification Search
CPC ... H01L 29/785–7851; H01L 29/66818; H01L 29/42392; H01L 29/0669; H01L 29/775; H01L 29/0673; H01L 29/66439; H01L 29/66545; H01L 21/823431; H01L 2029/7858

See application file for complete search history.

(56) References Cited

U.S. PATENT DOCUMENTS

| | | | |
|---|---|---|---|
| 2015/0035046 A1* | 2/2015 | Kim | H01L 27/0886 257/327 |
| 2015/0200276 A1* | 7/2015 | Cheng | H01L 29/785 257/401 |
| 2016/0204208 A1* | 7/2016 | Goel | H01L 21/02502 257/190 |
| 2016/0233246 A1* | 8/2016 | Anderson | H01L 29/7853 |
| 2016/0308032 A1* | 10/2016 | Glass | H01L 27/105 |
| 2016/0365416 A1* | 12/2016 | Metz | H01L 29/66795 |
| 2017/0005090 A1* | 1/2017 | Ando | H01L 27/0886 |
| 2017/0012132 A1* | 1/2017 | Sell | H01L 29/66818 |
| 2017/0053912 A1* | 2/2017 | Ching | H01L 21/764 |
| 2017/0133377 A1* | 5/2017 | Glass | H01L 21/3081 |
| 2018/0130802 A1* | 5/2018 | Wang | H01L 27/0928 |
| 2018/0374752 A1* | 12/2018 | Zhou | H01L 27/0886 |

OTHER PUBLICATIONS

International Search Report and Written Opinion received for PCT Application No. PCT/US2017/054034. dated Jul. 31, 2018. 9 pages.

* cited by examiner

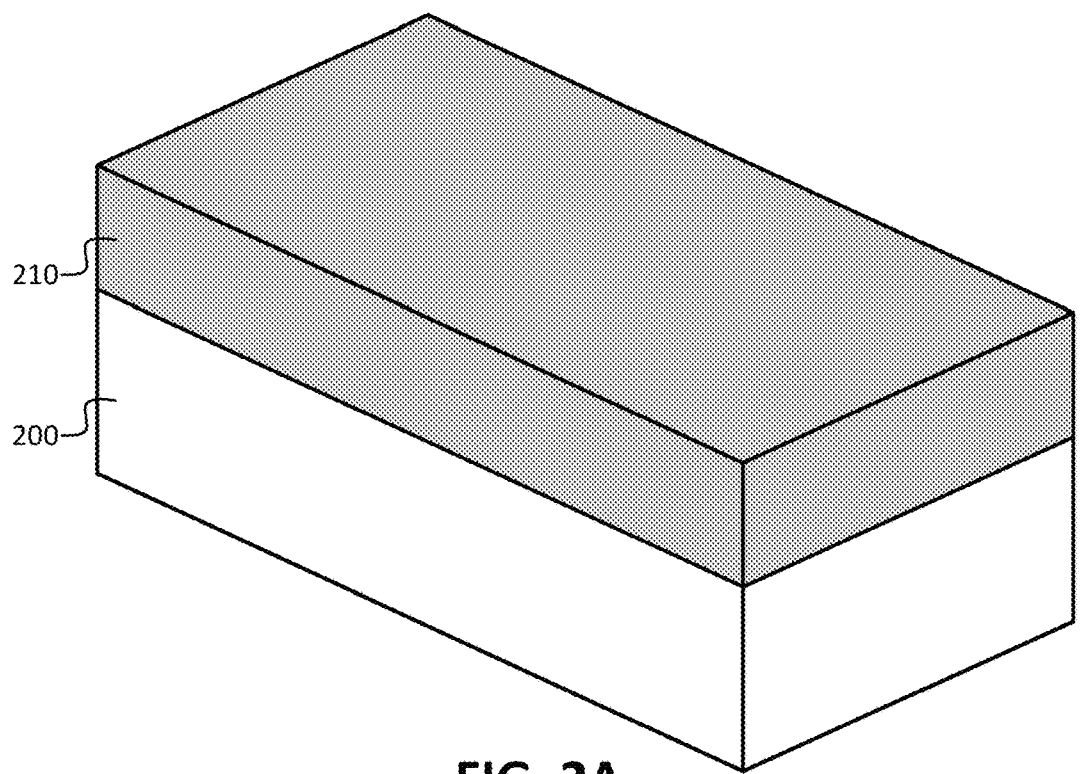
FIG. 2A
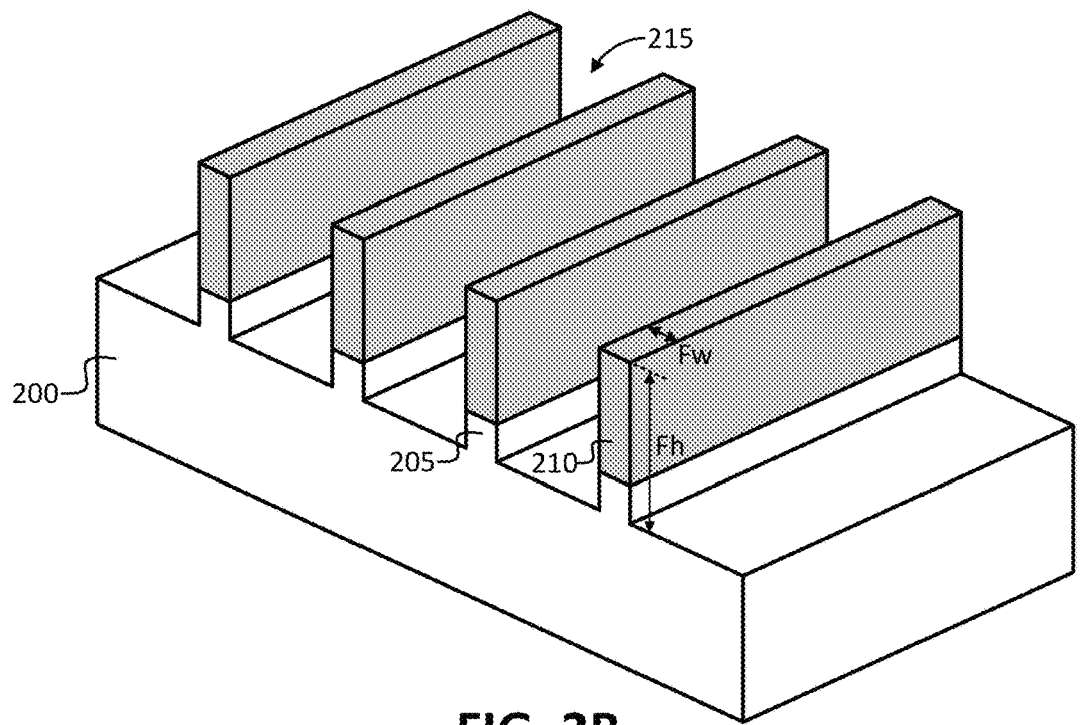
FIG. 2B
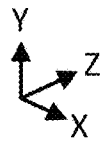

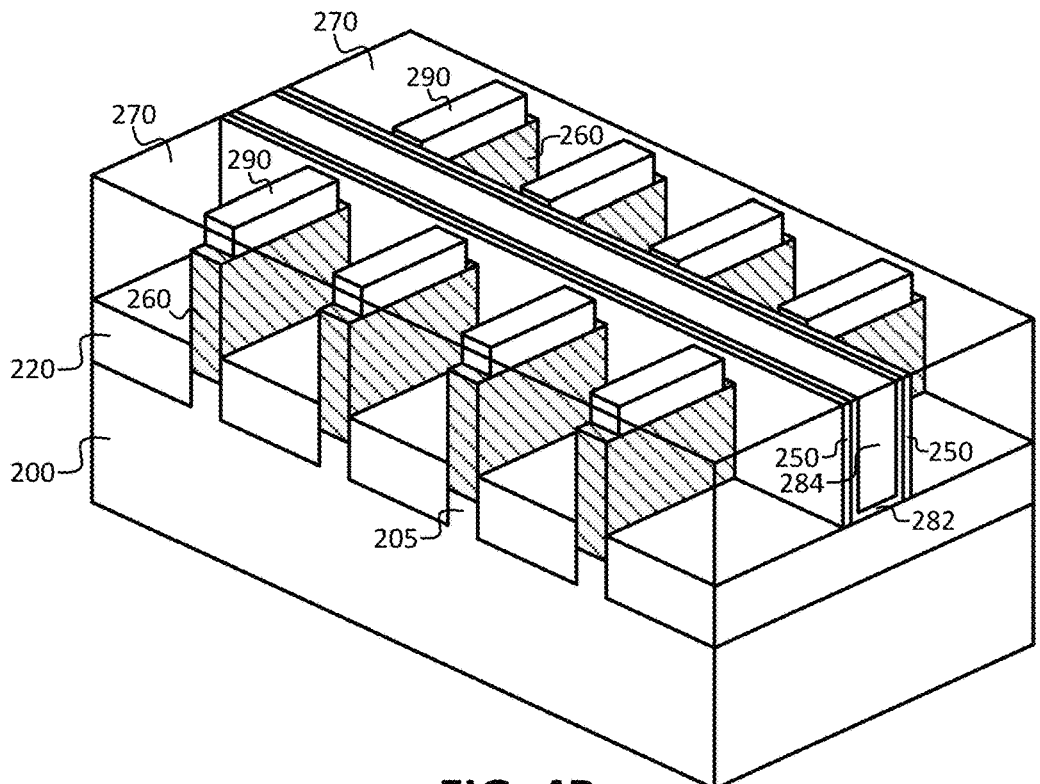
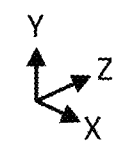
FIG. 4B
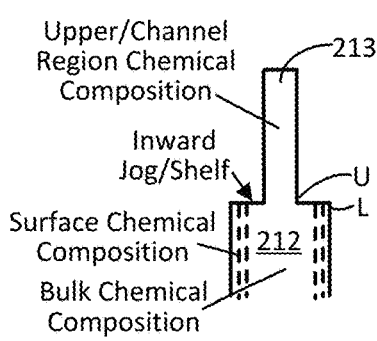
FIG. 5A
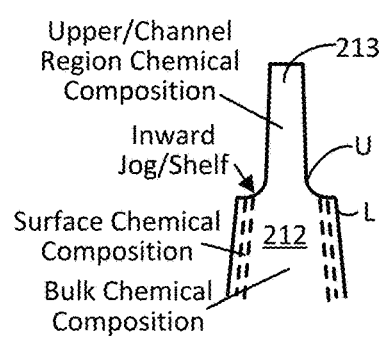
FIG. 5B
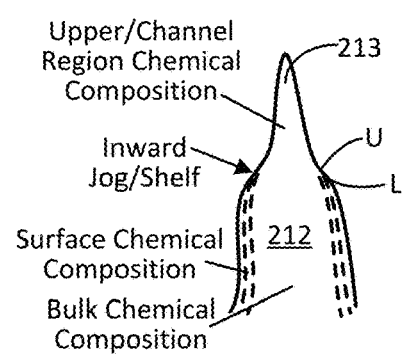
FIG. 5C
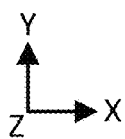

US 11,069,795 B2

TRANSISTORS WITH CHANNEL AND SUB-CHANNEL REGIONS WITH DISTINCT COMPOSITIONS AND DIMENSIONS

CROSS REFERENCE TO RELATED APPLICATIONS

This application is a U.S. national stage entry under 35 U.S.C. § 371(c) of International Application No. PCT/US17/54034, filed Sep. 28, 2017, the disclosure of which is incorporated by reference herein in its entirety.

BACKGROUND

Increased performance of circuit devices including transistors, diodes, resistors, capacitors, and other passive and active electronic devices formed on a semiconductor substrate is typically a major factor considered during design, manufacture, and operation of those devices. For example, during design and manufacture or forming of metal-oxide-semiconductor (MOS) transistor semiconductor devices, such as those used in complementary metal-oxide-semiconductor (CMOS) devices, it is often desired to increase movement of electrons (carriers) in n-type MOS device (n-MOS) channels and to increase movement of positive charged holes (carriers) in p-type MOS device (p-MOS) channels. Finned transistor configurations include a transistor built around a thin strip of semiconductor materials (generally referred to as the fin). The transistor includes the standard field effect transistor (FET) nodes, including a gate, a gate dielectric, a source region, and a drain region. The conductive channel of the device effectively resides in the fin, adjacent the gate dielectric. Because the conductive channel of such configurations includes the three different, planar regions of the fin, such configurations have been termed as finFET and tri-gate transistors. Other types of finned configurations can also be used, such as so-called double-gate finFETs, in which the conductive channel principally includes only the two sidewalls of the fin (and not the top of the fin, for example).

BRIEF DESCRIPTION OF THE DRAWINGS

FIGS. 2A-F illustrate perspective views of example structures that are formed when carrying out a portion of the method of FIG. 1, in accordance with some embodiments of the present disclosure.

FIG. 3A' is a blown-out version of portion A-A from FIG. 3A, illustrating details of a fin from the example structure of FIG. 3A, in accordance with some embodiments.

FIG. 3B' is a blown-out version of portion B-B from FIG. 3B, illustrating details of a fin from the example structure of FIG. 3B after the etch and clean has been performed, in accordance with some embodiments.

FIG. 3C' is a blown-out version of portion C-C from FIG. 3C, illustrating a gate-all-around (GAA) variation to the channel region structure, in accordance with some embodiments.

FIGS. 4A-B illustrate perspective views of example structures that are formed when carrying out a portion of the method of FIG. 1, in accordance with some embodiments. Note that FIG. 4A continues with the example structure of FIG. 3C, where the final gate structure has already been formed.

FIGS. 5A-C each illustrate aspects of the resulting structure after performing a trim etch to achieve trimmed fins in the channel region, in accordance with various embodiments.

Figure 1:
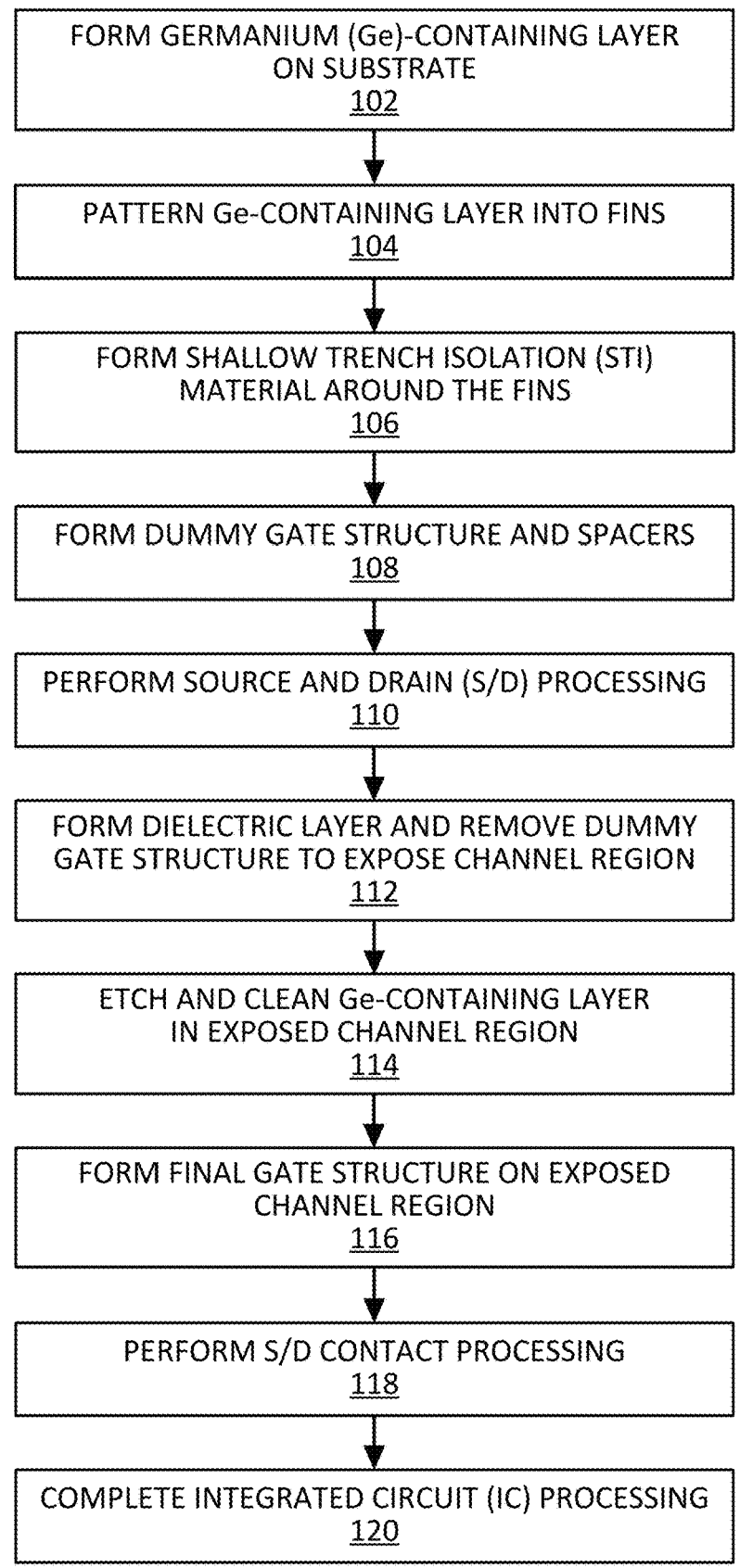
FIG. 1 shows a method of forming an integrated circuit structure including transistors with channel and sub-channel regions with distinct compositions and dimensions, in accordance with one or more embodiments of the present disclosure.

The figures depict various embodiments of the present disclosure for purposes of illustration only. In the drawings, each identical or nearly identical component that is illustrated in various figures may be represented by a like numeral. For purposes of clarity, not every component may be labeled in every drawing. As will be appreciated, the figures are not necessarily drawn to scale or intended to limit the present disclosure to the specific configurations shown. For instance, while some figures generally indicate straight lines, right angles, and smooth surfaces, an actual implementation of a transistor structure may have less than perfect straight lines, right angles, and some features may have surface topology or otherwise be non-smooth, given real world limitations of the processing equipment and techniques used. In short, the figures are provided merely to show example structures. Numerous variations, configurations, and other embodiments will be apparent from the following detailed discussion.

DETAILED DESCRIPTION

Techniques are disclosed for forming semiconductor integrated circuits including fins including a channel region and a sub-channel region, the sub-channel region having a first semiconductor composition and opposing sidewalls adjacent to an insulator material, and the channel region having a second semiconductor composition and opposing sidewalls adjacent to and in contact with the gate dielectric. A first width indicating the distance between the opposing sidewalls of the sub-channel region at a first location is at least 1 nm wider than a second width indicating the distance between the opposing sidewalls of the channel region at a second location, the first location being within 5, 10, 15, 20, or 25 nm in the vertical direction of the second location. In other words, the channel region of the semiconductor fin is defined by the gate structure such that the gate structure is adjacent to one or more sides of the channel region, and the sub-channel region (or base region) of the fin is below the channel region. Thus, in some embodiments, the sub-channel region is relatively wider in the horizontal direction (e.g., at least 1, 2, 3, 4, 5, 6, 7, 8, 9, 10 nm, or greater) than the channel region when observing the two regions using a cross-section taken perpendicular to the length of the fin.

The first semiconductor composition is distinct from the second semiconductor composition. In particular, the first semiconductor composition includes a surface chemical composition at an outer surface of the opposing sidewalls of the sub-channel region and a bulk chemical composition therebetween. The surface chemical composition includes one or more of oxygen (O), nitrogen (N), carbon (C), chlorine (Cl), fluorine (F), and sulfur (S). In some embodiments, the presence of such chemicals in the surface of the semiconductor material is a result of damage through, for example, oxidation, nitridation, etc. In contrast, the second semiconductor composition includes a surface chemical composition at an outer surface of the opposing sidewalls of the channel region substantially devoid of these elements, according to some embodiments. For instance, in some embodiments, the second semiconductor composition may be completely devoid of those elements (O, N, C, Cl, F, and S), while in some embodiments, where those elements are present in relatively low concentrations, such concentrations may be less than 5, 4, 3, 2, or 1 atomic percent (atomic %), for example, or in some other trace amount. In some embodiments, the first width is in a range of between 7 nm and 30 nm wider than the second width. In certain embodiments, the first semiconductor composition includes a bulk chemical composition including 10 atomic % or more germanium, and the second semiconductor composition includes 10 atomic % or more germanium, wherein the bulk chemical composition is different from or the same as the second semiconductor composition, but the first semiconductor composition includes a higher concentration of germanium in the surface chemical composition than the bulk chemical composition. Numerous configurations and variations will be apparent in light of this disclosure.

General Overview

There are a number of non-trivial issues associated with fabricating fin-containing transistors. In the context of germanium (Ge) containing silicon (Si) fin-containing transistors, for example, chemical contamination and segregation at the channel-gate oxide interface can adversely affect the hole/electron mobility, particularly in silicon-germanium (SiGe) channel transistors, due to the enhanced reactivity of SiGe with foreign elements during processing, such as during etching or thermal treatment. Standard solutions to this problem have included a protective layer of chemically resistant material over the fin that protects the surface of the fin through processing up to the deposition of the gate dielectric over the channel. However, the protective layer is not a scalable solution with decreasing gate lengths at tight gate pitch (e.g., less than 100 nm) and is relatively expensive to implement.

Embodiments of the present disclosure recognize this problem and are configured to help mitigate or otherwise reduce chemical contamination and segregation at the channel-gate interface. A protective layer over the fin is not needed, as will be appreciated. Rather, the fin is exposed to processing and as a result generally incurs some process-induced changes to the surface, such as but not limited to surface damage. These changes may generally be characterized as damage, but any changes to surface chemical composition or concentration as provided herein are included, such as but not limited to damage. However, at gate processing time, the process induced changes in the channel region of the fin are removed. As will be further appreciated, the removal process results in the fin having unique structural details, such as a sub-channel region that is physically distinguishable from the channel region because of the surface composition of the sub-channel region, as explained herein.

Note that, as used herein, the expression "X includes at least one of A or B" refers to an X that may include, for example, just A only, just B only, or both A and B. To this end, an X that includes at least one of A and B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C.

Methodology and Architecture

FIG. 1 shows a method 100 of forming an integrated circuit structure including transistors with channel and sub-channel regions with distinct compositions and dimensions, in accordance with one or more embodiments of the present disclosure. As will be apparent in light of this disclosure, trimming/sculpting (e.g., using a trim etch as variously described herein) to achieve different fin channel dimensions is described herein in the context of a replacement metal gate (RMG) process. However, in some embodiments, the trimming/sculpting may be performed before gate (or dummy gate) deposition to trim each fin at least in the portions to become the channel regions, as will be discussed in more detail below. FIGS. 2A-2F, 3A-3C, and 4A-B illustrate example structures that are formed as the process flow or method 100 of FIG. 1 is carried out, in accordance with some embodiments. Although method 100 of FIG. 1 and the structures shown in FIGS. 2A-2F, 3A-3C, and 4A-B are depicted and described herein in the context of forming finned transistor configurations (e.g., tri-gate or finFET devices) having varying channel dimensions, similar principles and techniques as variously described herein may be used for other transistor configurations, including, for example, dual-gate, gate-all-around (e.g., nanowire/nanoribbon), and other semiconductor devices and configurations, as will be apparent in light of this disclosure. For instance, an example gate-all-around (GAA) device is shown in FIG. 3C' and described in more detail herein. Numerous variations and configurations will be apparent in light of this disclosure.

A multitude of different transistors and transistor-containing devices can benefit from the techniques described herein, which may include, but is not limited to, various different field-effect transistors (FETs), such as metal-oxide-semiconductor FETs (MOSFETs) or tunnel FETs (TFETs), to name a few examples. For example, in some embodiments, the techniques may be used to benefit an n-channel MOSFET (NMOS) device, which may include a source-channel-drain doping scheme of n-p-n or n-i-n, where 'n' indicates n-type doped semiconductor material, 'p' indicates p-type doped semiconductor material, and 'i' indicates intrinsic or essentially undoped semiconductor material. In another example, the techniques may be used to benefit a p-channel MOSFET (PMOS) device, which may include a source-channel-drain doping scheme of p-n-p or p-i-p, in accordance with some embodiments. In other words, the techniques described herein can be used to benefit transistor devices (such as MOSFET devices) that include source and drain (S/D) regions including the same type of impurities, where both S/D regions are either n-type doped or p-type doped. In yet another example, the techniques may be used to benefit a TFET device, which may include a source-channel-drain doping scheme of p-i-n or n-i-p, in accordance with some embodiments. In other words, the techniques described herein can be used to benefit transistor devices (such as TFET devices) that include S/D regions including opposite type of impurities, where one S/D region is n-type doped and the other is p-type doped.

Further, the techniques may be used to benefit complementary transistor circuits, such as complementary MOS (CMOS) circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Method 100 of FIG. 1 includes forming 102 a germanium (Ge)-containing layer 210 on substrate 200 to form the example resulting structure of FIG. 2A, in accordance with some embodiments. Substrate 200 may include, be formed from, deposited with, or grown from silicon, polycrystalline silicon, or single crystal silicon, for example. Substrate 200 may be formed using various other suitable technologies for forming a silicon base or substrate, such as a silicon single crystal wafer. Substrate 200 may be implemented, for example, with a bulk silicon, a silicon-on-insulator configuration (SOI), or with multi-layered structures, including those substrates upon which fins are formed prior to a subsequent gate patterning process. In other implementations, substrate 200 may be formed using alternate materials, which may or may not be combined with silicon, such as group IV semiconductor material and/or group III-V semiconductor material, such as germanium, silicon germanium, indium antimonide, lead telluride, indium arsenide, indium phosphide, indium gallium arsenide (e.g., $In_{0.7}Ga_{0.3}As$), gallium arsenide, or gallium antimonide, to name a few examples. In a more general sense, any material that may serve as a foundation upon which a semiconductor device may be built can be used in accordance with embodiments of the present disclosure.

Note that the use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example. For instance, in some embodiments, the techniques may include using a substrate that includes at least one of silicon (Si), germanium (Ge), tin (Sn), indium (In), gallium (Ga), aluminum (Al), arsenic (As), phosphorous (P), or antimony (Sb), to Jo provide some examples. In some embodiments, substrate 200 may be doped with any suitable n-type and/or p-type dopant. For instance, in the case, of a Si substrate, the Si may be p-type doped using a suitable acceptor (e.g., boron) or n-type doped using a suitable donor (e.g., phosphorous, arsenic), to provide some example cases. However, in some embodiments, substrate 200 may be undoped/intrinsic or relatively minimally doped (such as including a dopant concentration of less than 1E16 atoms per cubic cm), for example.

In some embodiments, an original substrate may be used to at least partially form one or more semiconductor devices (e.g., transistors). Those at least partially formed semiconductor devices may then be transferred to a host substrate or wafer to allow for backside processing to occur. In other words, in embodiments that utilize such a transfer and host substrate scheme, processing can occur on both sides of the transfer substrate after it has been coupled to the host substrate (e.g., via wafer bonding techniques). In some embodiments, substrate 200 may include a surface crystalline orientation described by a Miller plane of (100), (110), or (111), or its equivalents, for example. Although substrate 200, in this example embodiment, is shown as having a thickness (dimension in the Y-axis direction) similar to other layers shown in subsequent structures for ease of illustration, in some instances, substrate 200 may be much thicker than the other layers, such as having a thickness in the range of 50 to 950 microns, for example, or any other suitable thickness as will be apparent in light of this disclosure. In some embodiments, substrate 200 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure. For instance, two distinct chips may be formed separately and then bonded together to operatively couple the two distinct chips and the devices formed thereon (e.g., using flip-chip bonding).

Ge-containing layer 210, in some embodiments, may be formed 102 using any suitable deposition or epitaxial growth techniques, such as chemical vapor deposition (CVD), physical vapor deposition (PVD), atomic layer deposition (ALD), molecular beam epitaxy (MBE), and/or any other suitable techniques. Other optional processing may also occur, such as planarization/polishing techniques (e.g., chemical-mechanical polishing/planarization (CMP) techniques) to regain a planar top surface. Note that Ge-containing layer 210 is shown as shaded in FIG. 2A and subsequent figures for the sole purpose of assisting in visually identifying the layer. In some embodiments, Ge-containing layer 210 may include essentially only germanium, or germanium plus other materials, such as silicon, tin, and/or carbon, and optionally, suitable dopants (e.g., boron for p-type dopant, arsenic or phosphorous for n-type dopant). For instance, in cases where Ge-containing layer 210 is silicon germanium, it includes both silicon and germanium in some atomic ratio, which can be expressed as $Si_{1-x}Ge_x$, where x is the germanium atomic %, which may be, e.g., in the range of 1-99 atomic %, and the silicon atomic % can be determined from the germanium percentage (1−x). In general, the germanium concentration within the Ge-containing layer 210 may range from 5-100 atomic %, such as concentrations of approximately 5, 10, 15, 20, 25, 30, 35, 40, 45, 50, 55, 60, 65, 70, 75, 80, 85, 90, 95, or 100 atomic percent, where the approximately modifier denotes+/−1 atomic %. In some embodiments, the germanium concentration within the Ge-containing layer 210 may be at least 5, 10, 15, 20, 25, 30, 35, 40, 45, 50, 55, 60, 65, 70, 75, 80, 85, 90, or 95 atomic %. For instance, in an example embodiment, the Ge-containing layer 210 may include at least 30 atomic % Ge. In another example embodiment, the Ge-containing layer 210 may include nominally pure germanium that is at least 85 atomic % Ge. In some embodiments, the Ge-containing layer may have a thickness (dimension in the Y-axis direction) in the range of 5-400 nm, or greater, for example.

In some embodiments, Ge-containing layer 210 may include grading (e.g., increasing and/or decreasing) of the concentration of one or more materials within the feature, such as the grading of the germanium concentration, for example. For instance, in some such embodiments, the germanium concentration may be increased as the Ge-containing layer 210 is being formed, such that the germanium concentration is highest near the top of the Ge-containing layer 210, for example. While in other embodiments, the germanium concentration may be decreased as the Ge-containing layer 210 being formed, such that the germanium concentration is highest near the bottom of the Ge-containing layer 210 (closest to substrate 200). In still other embodiments, the germanium concentration may be increased and then decreased or decreased and then increased, such that a middle portion of the Ge-containing layer 210 may include a relatively higher or lower germanium concentration compared to the top and bottom portions of the Ge-containing layer 210. Such grading can be achieved by tuning the concentration of germanium in the reactant flow, for example. Such a configuration may be utilized to decrease the likelihood that dopant undesirably diffuses into the channel region and to decrease the S/D contact resistance. In some embodiments, the Ge-containing layer 210 may include a multilayer structure that includes at least two compositionally different material layers. Note that in some embodiments, substrate 200 need not be present, such that the Ge-containing layer 210 may be the only layer present in FIG. 2A (e.g., where a bulk Ge-containing substrate is utilized). Numerous variations on Ge-containing layer 210 will be apparent in light of this disclosure.

Method 100 of FIG. 1 continues with patterning 104 the Ge-containing layer 210 into fins, to form the example resulting structure of FIG. 2B, in accordance with some embodiments. The patterning 104 processing may include any suitable techniques, such as performing hardmasking, lithography, and/or etching. In some embodiments, the fin widths Fw (dimension in the horizontal or X-axis direction) may be in the range of 2-100 nm (or in a subrange of 2-10, 2-25, 2-40, 2-50, 2-75, 4-10, 4-25, 4-40, 4-50, 4-75, 4-100, 10-25, 10-40, 10-50, 10-75, 10-100, 25-40, 25-50, 25-75, 25-100, or 50-100 nm) or greater, or any other suitable value or range as will be apparent in light of this disclosure. In some embodiments, the fin heights Fh (dimension in the vertical or Y-axis direction) may be in the range of 5-400 nm (or in a subrange of 5-80, 5-100, 5-200, 10-50, 10-80, 10-100, 10-200, 10-400, 20-80, 20-200, 20-400, 40-80, 40-120, 40-200, 40-400, 50-200, 50-400, 60-120, 100-200, 100-400, or 200-400 nm) or greater, or any other suitable value or range as will be apparent in light of this disclosure. In some embodiments, the fin heights Fh may be at least 10, 20, 40, 50, 80, 100, 150, 200, 300, or 400 nm tall, or greater than any other suitable threshold height as will be apparent in light of this disclosure. In some embodiments, the height to width ratio of the fins (Fh:Fw) may be greater than 1, such as greater than 1.5, 2, 2.5, 3, 3.5, 4, 4.5, 5, 6, 7, 8, 9, or 10, or greater than any other suitable threshold ratio as will be apparent in light of this disclosure. Note that in the example embodiment of FIG. 2B, the fins include a portion 205 of substrate 200, such that the lower portion of those fins are native to substrate 200, as shown. However, the present disclosure is not intended to be so limited, as the fins may be formed such that the 200/210 interface may be relatively higher or lower than what is shown, or exactly at the bottom of the fins, for example.

As shown in FIG. 2B, the trenches 215 and fins are each shown as having essentially the same sizes and shapes in this example structure for ease of illustration. However, the present disclosure is not intended to be so limited. For example, in some embodiments, the fins may be formed to have varying heights Fh, varying widths Fw, varying starting points (or varying starting heights), varying shapes, and/or any other suitable variations as will be apparent in light of this disclosure. For example, in other embodiments, as described further below, the fins may have a rounded top, a triangular or tapered shape, or some other suitable fin shape as will be apparent in light of this disclosure. Moreover, trenches 215 between two given fins may be formed to have varying depths, varying widths, varying starting points (or varying starting depths), varying shapes, and/or any other suitable variations as will be apparent in light of this disclosure. Also note that although four fins are shown in the example structure of FIG. 2B for ease of illustration, any number of fins may be formed, such as one, two, three, five, ten, hundreds, thousands, millions, billions, and so forth, as can be understood based on this disclosure. Further note that the fins were formed by blanket depositing the Ge-containing layer 210 on or over at least a portion of the substrate 200 and then patterning that structure into fins, as was previously described. However, in some embodiments, the fins may be formed using a replacement fin scheme, as will be described in more detail herein. In some embodiments, some of the fins may be used for n-type MOS (NMOS) devices or p-type MOS (PMOS) devices, or fins formed using the techniques described herein may be used in a complementary MOS (CMOS) circuit that includes both NMOS and PMOS devices.

Figure 2C:
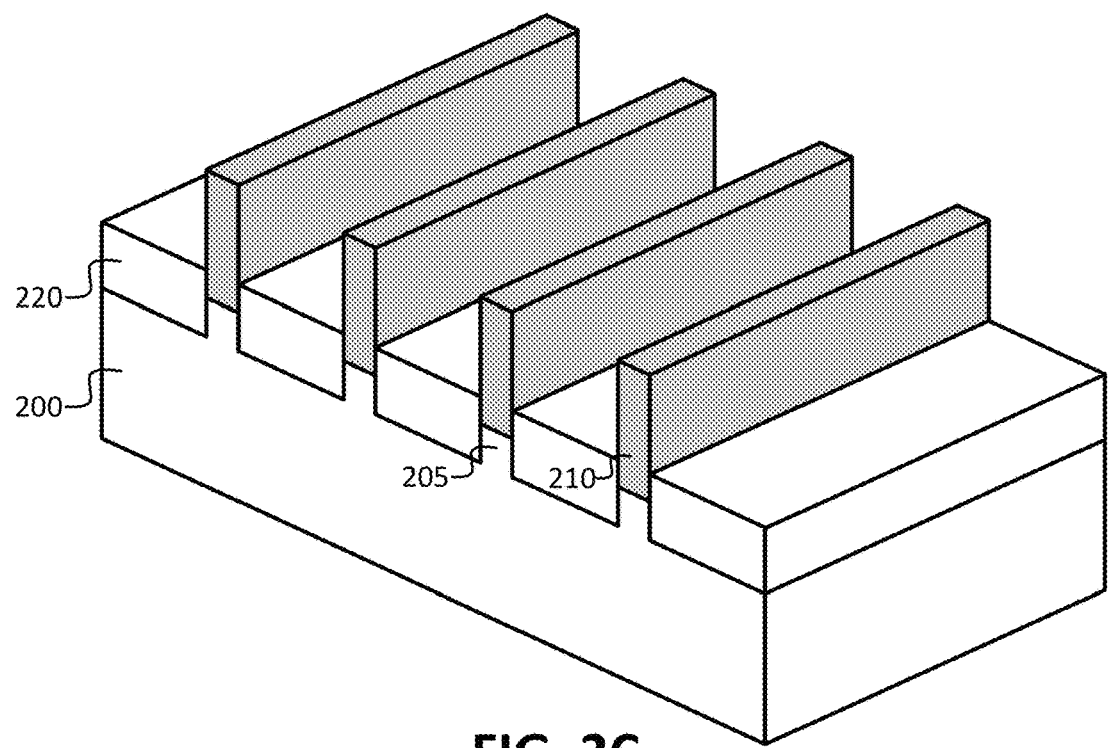

Method 100 of FIG. 1 continues with forming 106 shallow trench isolation (STI) material 220 around the fins, resulting in the example structure of FIG. 2C, in accordance with some embodiments. In some embodiments, deposition 106 of STI material 220 may include any suitable deposition techniques, such as CVD, ALD, PVD, spin-on deposition techniques (SOD), and/or any other suitable deposition process. In some embodiments, the STI material 220 may be formed to the height (dimension in the Y-axis direction) shown in FIG. 2C, while in other embodiments, the STI material may be deposited, that structure may then be planarized, and the STI material may then be recessed to the height shown (e.g., using selective etch processing that removes the STI material relative to the fin material, to allow the STI material 220 to be recessed). In some embodiments, STI material 220 (which may be referred to as an STI or insulator layer and may have multiple regions) may include any suitable electrically insulating material, such as one or more dielectric, oxide (e.g., silicon dioxide), and/or nitride (e.g., silicon nitride) materials. In some embodiments, STI material 220 may include carbon-doped oxides, such as carbon-doped silicon dioxide. In some embodiments, the material of STI layer 220 may be selected based on the material of substrate 200. For instance, in the case of a silicon substrate, the STI material may be selected to be silicon dioxide or silicon nitride, to provide some examples.

In embodiments where the fins shown in FIG. 2C are instead formed via a replacement fin scheme, such a scheme may include forming substrate 200 into fins, forming STI material around those fins to be removed, removing or at least recessing the native substrate fins to form fin-shaped trenches between the STI material regions, depositing the replacement fin material, and recessing the STI material, which can result in the same structure shown in FIG. 2C, for example. For instance, replacement fins including SiGe or Ge may be formed by removing to native Si fins during such processing and replacing them with the SiGe or Ge material, to provide some examples. In some such embodiments, all of the native substrate fins may be replaced or only a subset may be replaced (e.g., such that some replacement fins are available for subsequent processing and some native substrate fins remain for subsequent processing). Further, in some embodiments, the recess and replace process may be performed as many times as desired to form as many subsets of replacement fins as desired by masking off the areas not to be processed for each replacement fin subset processing. In some such embodiments, a first subset of replacement fins may be formed for n-channel transistors such as NMOS devices (e.g., where the first replacement material is selected to increase electron mobility) and a second subset of replacement fins may be formed for p-channel transistors such as PMOS devices (e.g., where the second replacement material is selected to increase hole mobility). For instance, high germanium content fins (e.g., with greater than 75 atomic % Ge) may be formed for PMOS devices while group III-V material fins (e.g., InGaAs or GaAs fins) may be formed for NMOS devices.

Further still, in some embodiments, a multilayer replacement fin may be formed to enable the subsequent formation of nanowires or nanoribbons in the channel region of one or more transistors, such as GAA transistors. In some such embodiments, some of the layers in the multilayer replacement fin are sacrificial and intended to be removed via selective etching (e.g., during replacement gate processing), which will be described in more detail herein. In some instances, the final fins used to form one or more transistor devices may be defined based on the pitch of those fins, where a given pitch includes the distance from the start of one fin to the start of another fin in the X-axis direction. In other words, a given pitch is equal to the width of one fin plus the width of one adjacent STI region. In some embodiments, the pitch for fins formed using the techniques described herein may range from 10-200 nm (or in a subrange of 10-20, 10-50, 10-100, 20-50, 20-100, 20-200, 50-100, 50-200, or 100-200 nm) or greater, or any other suitable value or range as will be apparent in light of this disclosure.

Figure 2D:
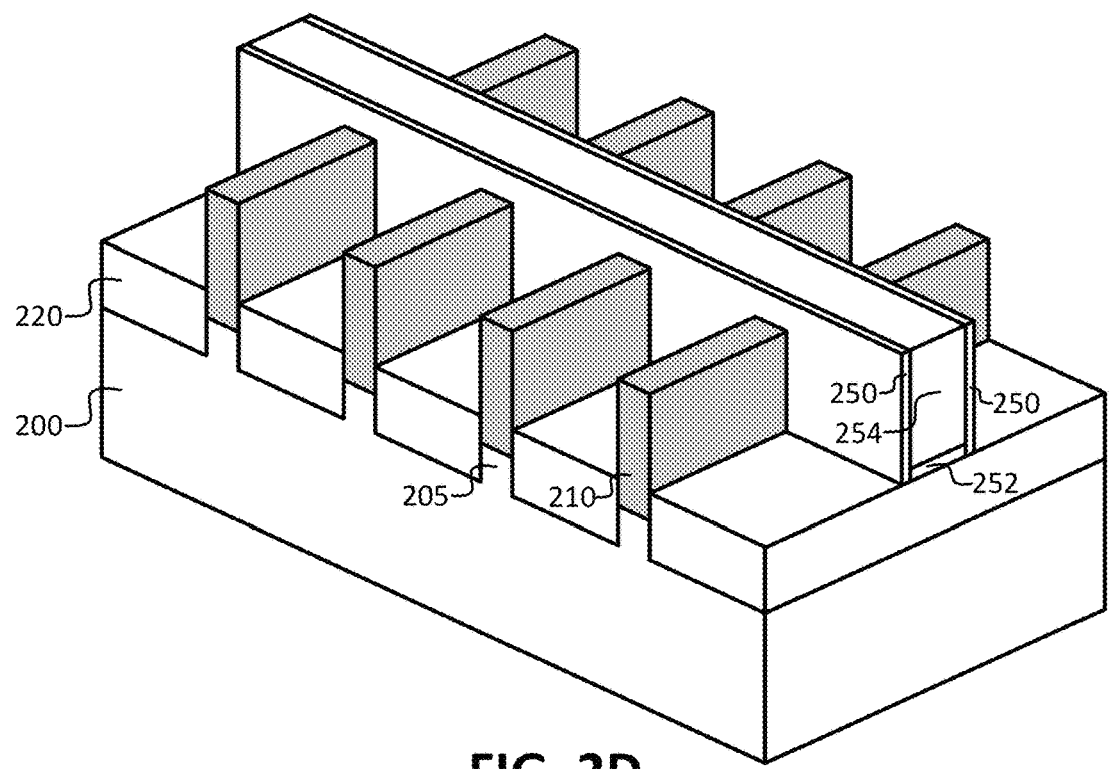

Method 100 of FIG. 1 continues with forming 108 a dummy gate structure and spacers on the structure of FIG. 2C to form the example resulting structure of FIG. 2D, in accordance with some embodiments. Recall that method 100 is primarily described herein in the context of a gate last transistor fabrication process flow, where the processing includes forming a dummy gate stack, performing the S/D processing, and then forming the final gate stack after the S/D regions have been processed. However, in other embodiments, the techniques may be performed using a gate first process flow. The description of method 100 will continue using a gate last process flow, to allow for such a flow (which generally includes additional processing) to be described.

Figure 2E:
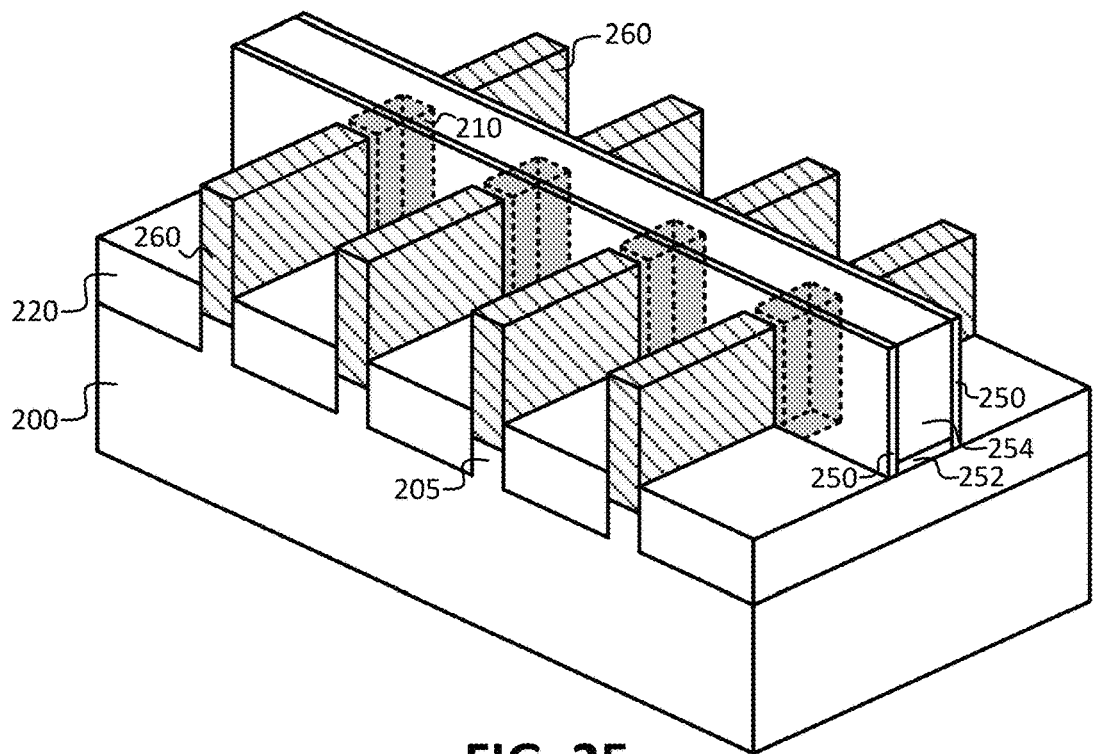

Continuing with forming 108 a dummy gate stack, such a dummy gate stack (where employed) may include dummy gate dielectric 252 and dummy gate electrode 254, thereby forming the example resulting structure of FIG. 2E, in this example embodiment. Dummy gate dielectric 252 (e.g., dummy oxide material) and dummy gate electrode 254 (e.g., dummy poly-silicon material) may be used for a replacement gate process, where those materials are intended to be sacrificial such that they can be later removed and replaced by a final gate structure, for example. As can be understood based on this disclosure, the dummy gate stack (and spacers 250) can help define the channel region and source/drain (S/D) regions of each fin, where the channel region is at least below the dummy gate stack (as it will be located below the final gate stack), and the S/D regions are on either side of and adjacent to the channel region. Note that because the IC structures are being described in the context of forming finned transistors, the final gate stack will also be adjacent to either side of the fin, as the gate stack will reside along three walls of the finned channel regions, in embodiments employing a finned (e.g., FinFET) configuration.

In this example embodiment, side-wall spacers 250 referred to generally as gate spacers (or simply, spacers), on either side of the dummy gate stack were also formed, and such spacers 250 can be used to help determine the channel length, to help with replacement gate processes, and/or to help electrically isolate the gate structure from other features (such as the S/D contacts), for example. Spacers 250 may include any suitable material, such as any suitable electrical insulator, dielectric, oxide (e.g., silicon oxide), and/or nitride (e.g., silicon nitride) material, as will be apparent in light of this disclosure. Spacers 250 may be formed using any suitable techniques, in accordance with some embodiments. The width (dimension in the Z-axis direction) may be selected as desired based on the particular application, in accordance with some embodiments.

Method 100 of FIG. 1 continues with performing 110 source and drain (S/D) processing to form the example resulting structure of FIG. 2E, in accordance with some embodiments. In this example embodiment, the source and drain (S/D) processing 110 included removing and replacing portions of the fins of the structure of FIG. 2D in the S/D regions to form final S/D regions 260 as shown in FIG. 2E. In other embodiments, the S/D processing may include cladding the fins in the S/D regions with final S/D material. In still other embodiments, the S/D processing may include implanting or otherwise introducing impurities into the fins in the S/D regions to cause those portions to be doped in a desired manner. Thus, the final S/D regions can be formed using any suitable techniques and can include numerous different variations and configurations, as can be understood based on this disclosure. Note that the S/D regions 260 are referred to herein as such for ease of description, but each S/D region may be either a source region or a drain region, such that the corresponding S/D region (on the other side of the channel region, and thus, on the other side of the gate structure) is the other of the source region and drain region, thereby forming a source and drain region pair.

In some embodiments, S/D regions 260 may include any suitable semiconductor material as will be apparent in light of this disclosure, such as monocrystalline group IV and/or group III-V semiconductor material. For instance, a given S/D region 260 may include one of monocrystalline Si, SiGe, Ge, GaAs, InGaAs, AlGaAs, AlAs, InP, and so forth.

In some embodiments, a given S/D region 260 may include n-type and/or p-type dopant (such as in one of the schemes described herein). In some embodiments, a given S/D region 260 may include grading (e.g., increasing and/or decreasing) of the concentration of one or more materials within the feature, such as the grading of a semiconductor material component concentration and/or the grading of the dopant concentration, for example. For instance, in some such embodiments, the dopant concentration included in a given S/D region 260 may be graded such that it is lower near the corresponding channel region and higher near the corresponding S/D contact, which may be achieved using any suitable processing, such as tuning the amount of dopant in the reactant flow (e.g., during an in-situ doping scheme). Such a configuration may be utilized to decrease the likelihood that dopant undesirably diffuses into the channel region and to decrease the S/D contact resistance. In some embodiments, a given S/D region 260 may include a multilayer structure that includes at least two compositionally different material layers. In some embodiments, a given S/D region may be raised such that it extends higher than a corresponding channel region. Numerous S/D region configurations and variations will be apparent in light of this disclosure.

Figure 2F:
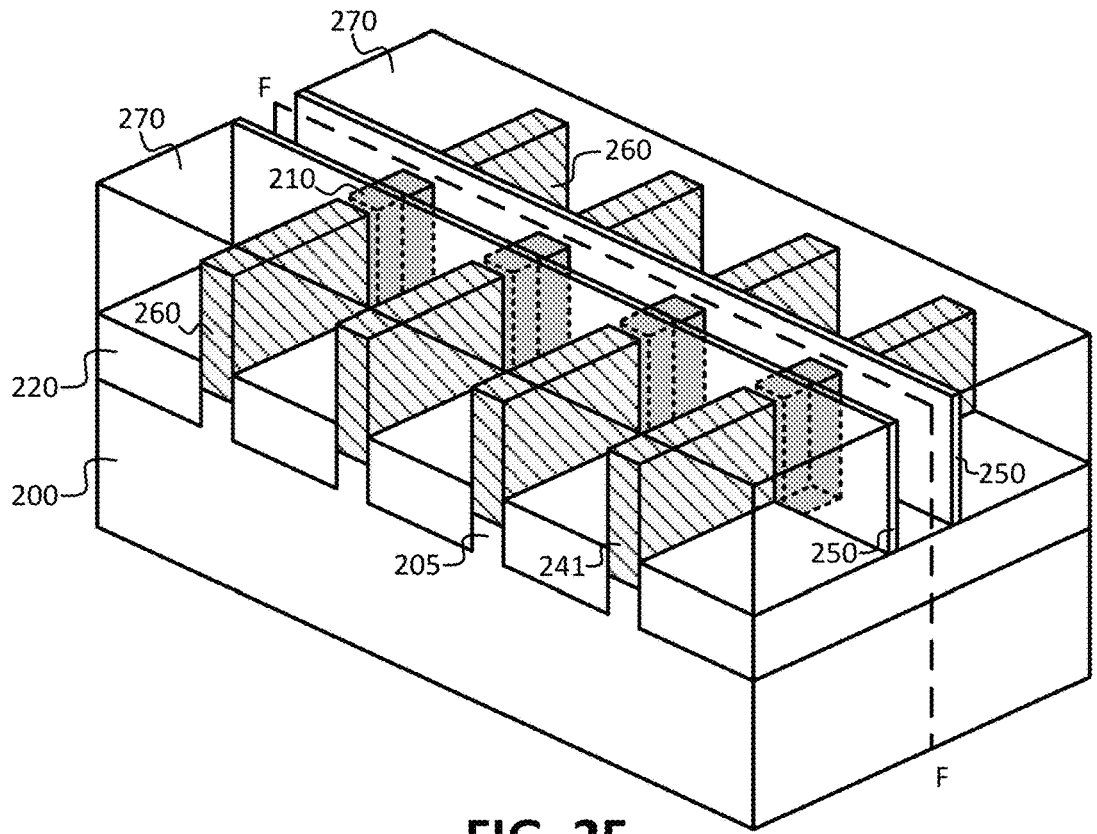

Method 100 of FIG. 1 continues with forming 112 a dielectric layer 270 over the structure of FIG. 2E, planarizing/polishing as desired, and then removing the dummy gate structure (which included dummy gate dielectric 252 and dummy gate electrode 254) as shown in the example resulting structure of FIG. 2F, in accordance with some embodiments. As can be understood based on this disclosure, removing the dummy gate structure exposes the channel region of the eventual transistor device(s) formed using the techniques described herein, which in this example case, is a portion of the fins formed from Ge-containing layer 210 as shown. Dielectric layer 270 may be referred to as an interlayer dielectric (ILD) layer, and may be formed using any suitable techniques (e.g., deposition via ALD, CVD, or PVD). In some embodiments, the dielectric or ILD layer 270 may include any desired electrical insulator, dielectric, oxide (e.g., silicon dioxide), and/or nitride (e.g., silicon nitride) material, as will be apparent in light of this disclosure. In some embodiments, the dielectric layer 270 may include carbon-doped silicon dioxide (or other carbon-doped oxides). In some embodiments, it may be desired to select material for dielectric layer 270 that has a low dielectric constant and a high breakdown voltage. In some embodiments, to decrease dielectric constant, the dielectric layer 270 may be formed to be intentionally porous, such as porous carbon-doped oxide (e.g., porous carbon-doped silicon dioxide). Note that dielectric layer 270 may include a multilayer structure, even though it is illustrated as a single layer. Also note that in some cases, the dielectric layer 270 and the STI layer 220 may not include a distinct interface as shown in FIG. 2F, particularly where, e.g., the dielectric layer 270 and STI layer 220 include the same material.

Planarization and/or polishing of the structure after dielectric layer 270 is formed may be performed using any suitable techniques, such as CMP processing, for example. Removing the dummy gate structure may include any suitable techniques, such as hardmasking, lithography, polishing, etching and/or cleaning as will be apparent in light of this disclosure to form the resulting structure of FIG. 2F. Note that in some embodiments, the dummy gate layers may be selectively etched relative to surrounding materials, such as selectively etching the dummy gate dielectric relative to the Ge-containing layer 210 material and relative to the STI 220 material, such that the dummy gate dielectric can be removed while preserving the 210 and 220 material.

Figure 3A:
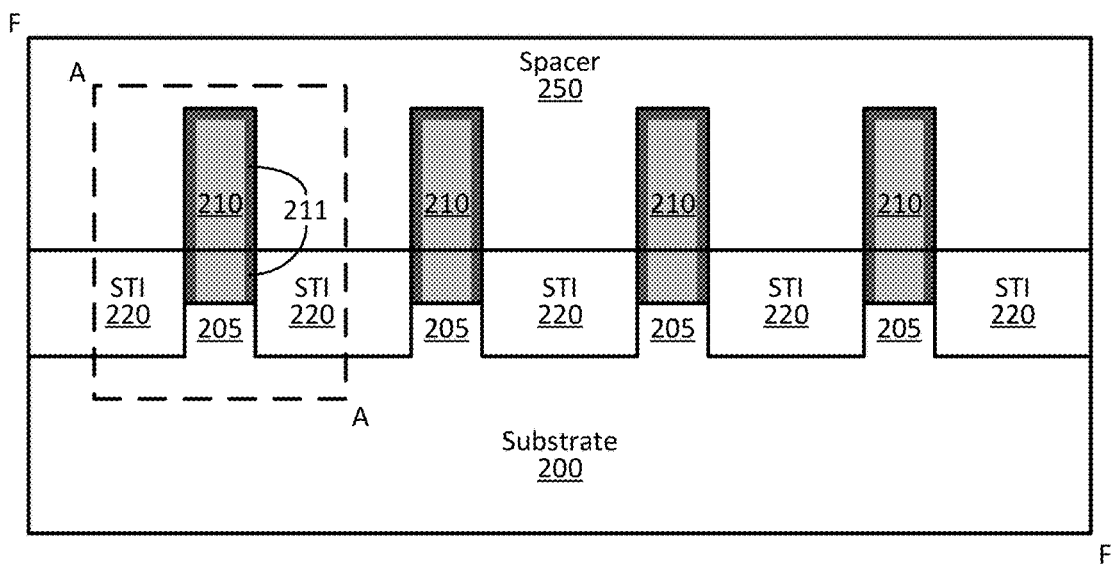
FIG. 3A illustrates a cross-sectional view along plane F-F from FIG. 2F, which cuts through the channel region and is perpendicular to the fins, in accordance with some embodiments of the present disclosure.

As shown in FIG. 2F, after the dummy gate structure has been removed, the channel region is exposed (or what may become the channel region, once the device is fully fabricated), with the F-F plane crossing through that exposed channel region. FIG. 3A illustrates a cross-sectional view along that F-F plane from FIG. 2F, which cuts through the channel region and is perpendicular to the fins, in accordance with some embodiments. Illustration of resulting structures formed from method 100 of FIG. 1 continues with such a cross-sectional view for ease of illustration. Note that the darker shading 211 shown around the fins of Ge-containing layer 210 is provided to visually indicate where the chemical composition of the Ge-containing layer 210 changed. Such changes resulting in the formation of region 211 within the fins of the Ge-containing layer 210 may be caused by exposure to oxidizing treatments or depositions, masking layers/photoresist deposition and removal, etch plasmas and chemistries, ash treatments, and/or other fabrication processing. For instance, the changes that cause the formation of region 211 within the Ge-containing layer 210 may be a result of damage in the form of atoms being out of their crystal lattice sites, which may be described as amorphization (the opposite of a well-ordered crystalline structure) or partial amorphization, in some embodiments. Another metric of damage may be the presence of relatively high oxygen, nitrogen, carbon, chlorine, fluorine, and/or sulfur levels in the outer few surface monolayers of the Ge-containing layer 210, in some embodiments. In some such embodiments, given that the surface concentration of SiGe atoms may be 5E15 atoms per square centimeter (cm) (at/cm$^2$), if relatively high O, N, C, Cl, F, and/or S impurities are present, they would be present at concentrations above 1E12, 5E12, or 1E13 at/cm$^2$ for any of the species, for example.

In addition, when the Ge-containing layer 210 fin is exposed to oxidizing conditions, silicon within the fin (if so present) may diffuse to the surface relatively faster than the germanium within the fin, leaving a slightly germanium enriched layer near the surface of the fin, which may also or alternatively be representative of what the darkened region 211 indicates, in accordance with some embodiments. Such embodiments including a concentration profile change may be referred to as a chemical segregation that occurs based on, for example, annealing or other processing during the fabrication of the devices described herein. By performing the etch and clean processing 114 described herein, which may be referred to as fin trimming or narrowing techniques, the undesired darkened region 211 can be removed to reveal a more desirable surface for final gate formation, thereby enabling the formation of higher quality transistor devices therefrom.

Figure 3B:
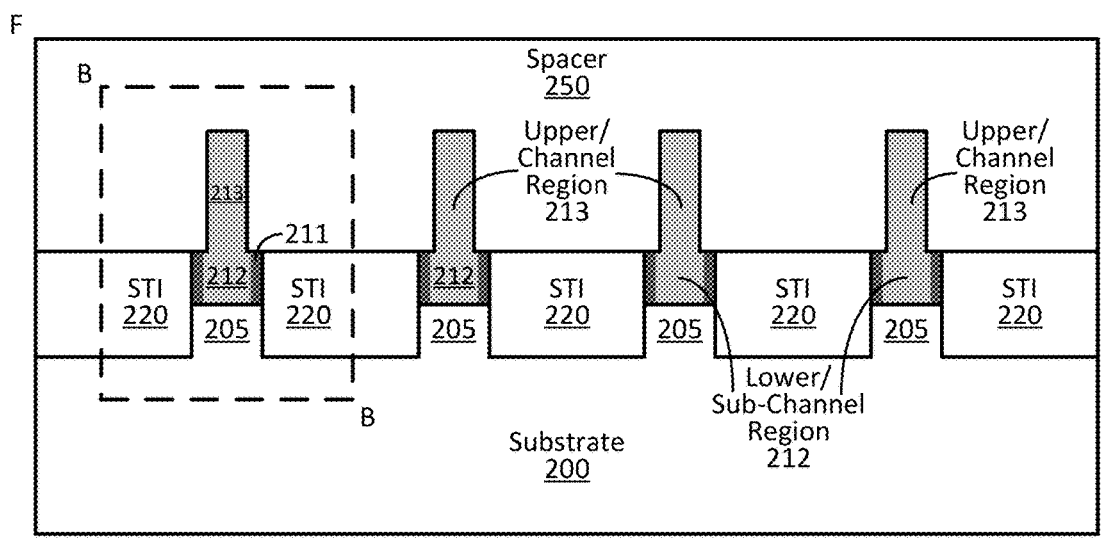
FIG. 3B illustrates the cross-sectional view of FIG. 3A after the Ge-containing layer in the exposed channel region has been etched and cleaned, in accordance with some embodiments of the present disclosure.
Figure 3A:
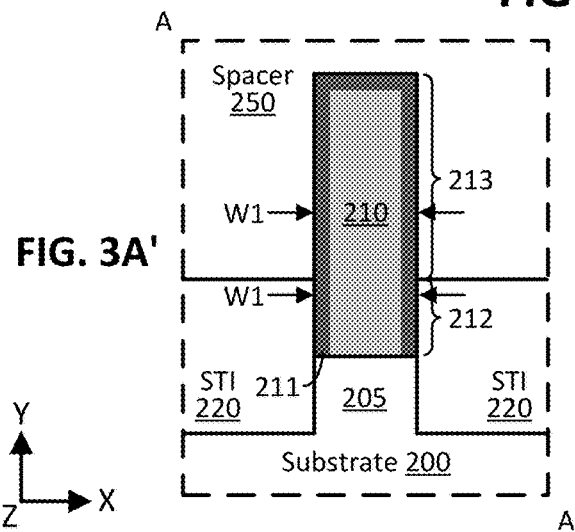
Figure 3B:
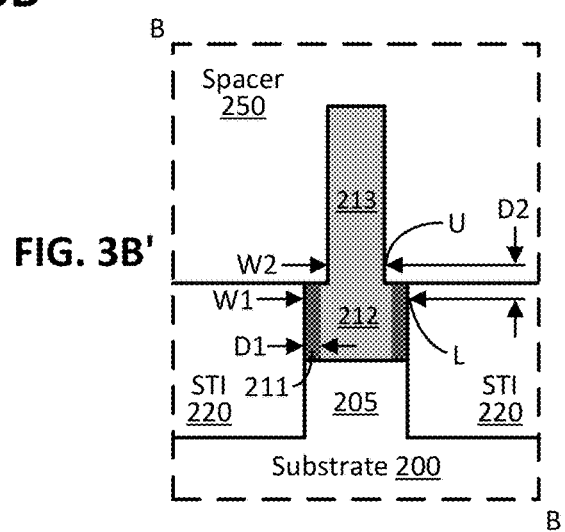
Figure 3C:
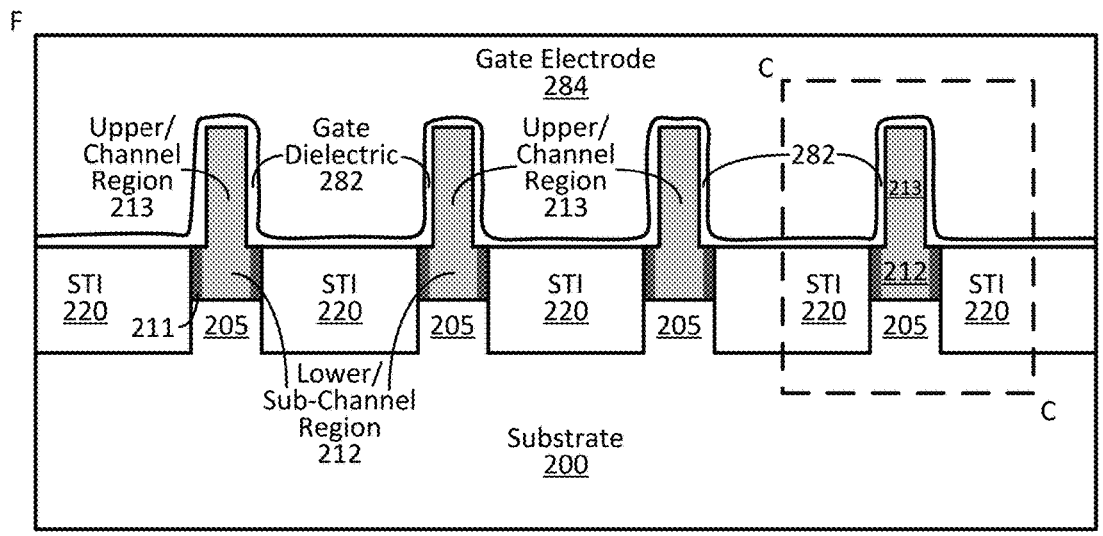
FIG. 3C illustrates the cross-sectional view of FIG. 3B after the final gate structure has been formed, in accordance with some embodiments of the present disclosure.
Figure 3C:
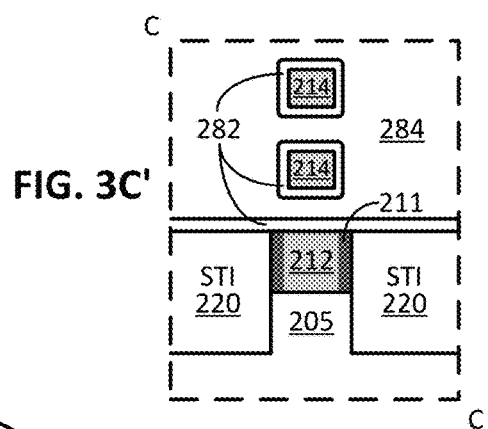

Method 100 of FIG. 1 continues with performing 114 etching and/or cleaning of the Ge-containing layer 210 in the exposed channel region to form the resulting structure of FIG. 3B, in accordance with some embodiments. In this example embodiment, the etch and/or cleaning processing, referred to herein as a trimming process 114 due to the result of the process, included performing a trim etch of the opposing sidewalls of the upper or channel region 213 of the fins to achieve sculpted/trimmed fins in those upper/channel regions 213. In some embodiments, the trim processing 114 may be performed using a plasma assisted etch process utilizing etching gases including one or more of chlorine (Cl), fluorine (F), nitrogen (N), argon (Ar), hydrogen (H), helium (He), carbon (C), oxygen (O), sulfur (S), and xenon (Xe) containing chemistry, operating with either a direct or a remote plasma, at a substrate temperature in a range of between 15 and 400 degrees Celsius, for example. However, any number of suitable etching and/or cleaning processes may be used to form the example resulting structure of FIG. 3B, as will be apparent in light of this disclosure. Note that the region below the upper/channel region 213 of the Ge-containing layer 210 fins is indicated as lower or sub-channel region 212, as shown in FIG. 3B. Also note that the darkened region 211 that was around a portion of the original Ge-containing layer 210 fin is still present in the lower/sub-channel region 212, as it was not removed via the trim processing 114 described herein, due to that portion not being exposed during such processing, as can be understood based on this disclosure.

FIG. 3A' is a blown-out version of portion A-A from FIG. 3A, illustrating details of a fin from the example structure of FIG. 3A, in accordance with some embodiments. FIG. 3B' is a blown-out version of portion B-B from FIG. 3B, illustrating details of a fin from the example structure of FIG. 3B after the etch and clean has been performed. As can be seen in FIG. 3A', the initial width (dimension in the X-axis direction) of the fin in both the upper/channel region 213 and the lower/sub-channel region 212 is W1, in this example embodiment. However, in other embodiments, the initial widths may be different, such as in the case of, e.g., a triangular, curved, and/or tapered fin (as opposed to the rectangular fin shown in FIG. 3A'). After the trim processing 114 has been performed, the resulting structure is shown in FIG. 3B', where the upper/channel region 213 of the fin has a resulting width of W2, while the lower/sub-channel region 212 maintained the initial width of W1.

As shown in the example embodiment of FIG. 3B', the lower/sub-channel region 212 has opposing sidewalls adjacent to the insulator material of STI regions 220 and first width W1 indicating the distance between the opposing sidewalls of the lower/sub-channel region 212 at a first location L (to indicate it is a location in the lower region 212). Further, the upper/channel region 213 has opposing sidewalls and second width W2 indicating the distance between the opposing sidewalls of the upper/channel region 213 at a second location U (to indicate it is a location in the upper region 213), in this example embodiment. In some such embodiments, the first location L may be within 10 nm, such as within 8 nm, or within 6 nm, or within 4 nm, or within 2 nm, or within 1 nm, or within 0.5 nm of the second location U, or some other suitable value as will be apparent in light of this disclosure. Note that this distance between locations L and U is generally depicted in FIG. 3B' as D2. In some embodiments, the first width W1 may at least 1 nm wider than the second width W2. In some such embodiments, the first width W1 may be approximately or at least 2, 4, 5, 10, 15, 20, 25, or 30 nm wider than the second width W2, or some other suitable approximate or threshold value as will be apparent in light of this disclosure. Note that the aforementioned approximate values are approximate within +/10% of the nominal value (e.g., approximately 2 nm would be 1.8-2.2 nm and approximately 30 nm would be 27-33 nm, and so forth).

As a result of the trimming process 114, note an inward jog or shelf may be formed on top of the lower/sub-channel region 212, proximate to either sidewall at the base of the upper/channel region 213. FIGS. 5A-C depict this inward jog or shelf, according to various embodiments of the present disclosure. Note that the shelf is depicted as perfectly horizontal in FIG. 5A, but in reality may be somewhat angled or otherwise not flat and orthogonal, such as shown in FIGS. 5B and 5C. Likewise, the fin of FIG. 5A is shown as having perfectly straight sidewalls, but in reality the sidewalls can be tapered such that the bottom of the fin is wider than the top of the fin, such as shown in FIGS. 5B and 5C. The fin may also have a rounded top, as shown in FIG. 5C. In any such cases, note that the fin trimming process will cause a detectable inward jog proximate the interface between the channel and sub-channel portions of the fins, which is in addition to any tapering in the fin that results from normal fin forming techniques. In any such cases, the inward jog or shelf to either side of the fin may be symmetrical such that they are similar in length and slope/shape. So, for instance, if the first width W1 is 30 nm wider than the second width W2, then the left side inward jog/shelf may be about 15 nm, and the right side inward jog/shelf may be about 15 nm. Further note, however, that perfect symmetry is not required, and other embodiments may be configured differently, depending on factors such as the fin materials and the fin trim etch process used, as will be appreciated in light of this disclosure. In some such embodiments, the first width W1 is in a range of between 7 nm and 30 nm wider than the second width W2.

As also seen in FIGS. 3B', 5A, 5B, and 5C, after trim processing 114, the lower/sub-channel region 212 of the trimmed fins (which is not significantly trimmed) may include a first semiconductor material with a first semiconductor composition and the upper/channel region 213 of the trimmed fins (which is significantly trimmed) may include a second semiconductor material with a second semiconductor composition. In some embodiments, the first semiconductor composition may be distinct from the second semiconductor composition, as generally depicted by the dashed vertical-going lines in the sub-channel regions 212 of FIGS. 5A-C, which is also indicated as 211 in FIG. 3B'. In more detail, the first semiconductor composition may include telltale signs of process induced changes to the lower/sub-channel region incurred during processing after fin formation. In particular, the first semiconductor composition may include a surface chemical composition at an outer surface of the opposing sidewalls of the lower/sub-channel region 212 (generally depicted with the dashed vertical-going lines or the darker shading) and a bulk chemical composition between the two opposing outer surfaces. In some embodiments, the surface chemical composition includes one or more of oxygen (O), nitrogen (N), carbon (C), chlorine (Cl), fluorine (F), and sulfur (S). In some such embodiments, the first semiconductor composition of the lower/sub-channel regions 212 may include a bulk chemical composition including 10 atomic % or more germanium up to 100 atomic % germanium, and the second semiconductor composition of the upper/channel regions 213 may include 10 atomic % or more germanium up to 100 atomic % germanium, wherein the bulk chemical composition of the lower/sub-channel regions 212 may be different from or the same as the second semiconductor composition of the upper/channel regions 213. In some such embodiments, within the lower/sub-channel region 212, the first semiconductor composition may include a higher concentration of germanium in the surface chemical composition than the bulk chemical composition.

In some embodiments, a concentration of germanium in the surface chemical composition of the lower/sub-channel regions 212 is at least 10 atomic % or more higher than the germanium concentration of the bulk chemical composition within those regions 212, the second semiconductor composition of the upper/channel regions 213 having a germanium concentration that varies less than 10 atomic %, such increased germanium concentration at the surface of the sub-channel regions 212 being indicative of process-induced changes incurred as a result of post fin-formation processing. In some cases, the upper/channel region 213 may be substantially the same as the bulk chemical composition of the lower/sub-channel portion 212 (e.g., Ge or SiGe having a germanium concentration in a range of between 10 atomic % and 99 atomic %, or in other words, SiGe having a germanium concentration in a range of between 10 atomic % and 100 atomic %, as 100 atomic % germanium SiGe would be just Ge), while in other cases the upper/channel portion 213 is compositionally different from the bulk chemical composition of the lower/sub-channel portion 212 (e.g., compositionally different in germanium concentration by at least 10, 15, 20, 25, or 30 atomic %, or a germanium-containing lower/sub-channel portion 212 and an upper/channel portion 213 including indium gallium arsenide or other III-V semiconductor compound). Several specific examples are listed in Table 1. Numerous variations will be apparent.

TABLE 1

Specific Example Device Compositions*

| Substrate | Sub-Channel bulk | Sub-Channel surface | Channel Region | S/D Regions |
|---|---|---|---|---|
| Si | SiGe 30 atomic % Ge | SiGe 40 atomic % Ge | SiGe 30 atomic % Ge | Boron-doped SiGe |
| Si | SiGe 50 atomic % Ge | SiGe 70 atomic % Ge | SiGe 50 atomic % Ge | Boron-doped SiGe |
| Si | SiGe 30 atomic % Ge | SiGe 50 atomic % Ge | SiGe 30 atomic % Ge | Boron-doped SiGe |
| Si | SiGe 30 atomic % Ge | SiGe 40 atomic % Ge | SiGe 10 atomic % Ge | Boron-doped SiGe |
| Si | SiGe 30 atomic % Ge | SiGe 40 atomic % Ge | SiGe 10 atomic % Ge | Phosphorus-doped Si |
| Si | Group IV (e.g., Si, Ge) | Group IV (e.g., Si, Ge) | Group III-V (e.g., InGaAs) | Tin-doped InP |

*Note that the specific atomic % values given in Table 1 may vary within an acceptable tolerance (e.g., +/−5 atomic %, or +/−10 atomic %, or +/−20 atomic %) or otherwise vary from one embodiment to the next, as will be appreciated.

As also shown in FIGS. 33, 5A, 5B, and 5C, the surface chemical composition of the lower/sub-channel region 212 extends from the outer surface of the opposing sidewalls of that region 212 to a distance D1 therebetween in a range of between 0.5 nm and 10 nm, such as a range of between 2 nm and 8 nm, or a range of between 3 nm and 5 nm, or a range of 2 nm and 4 nm, or any other sub-ranges between 0.5 nm and 10 nm. The presence, concentration, and depth profile of O, N, C, Cl, F, S, and/or Ge can be determined by scanning electron microscopy (SEM), tunneling electron microscopy (TEM), energy dispersive X-ray spectroscopy (EDX), secondary ion mass spectroscopy (SIMS), or atom probe tomography (APT). In certain embodiments, the surface concentration of O, N, C, Cl, F, S, and/or Ge is in excess of 1E12, 5E12, or 1E13 atoms/cm$^2$. The bulk chemical composition of the lower/sub-channel regions 212 may also include concentrations of O, N, C, Cl, F, S in excess of 1E17 atoms/cm$^3$, however, the telltale signs of process induced changes attributable to the lower/sub-channel region 212 including the presence of O, N, C, Cl, F, S, and/or Ge above certain thresholds (e.g., in excess of 1E17 atoms/cm$^3$, or an areal density in excess of 1E10 atoms/cm$^2$) would be lacking in the upper/channel region 213.

In some embodiments, the principles and techniques as variously described herein may be used to sculpt/trim the entirety of fins in an opened area, before gates (or dummy gates) are deposited. For example, this may include lithographically defining (e.g., hardmasking and patterning) an area to be sculpted/trimmed and then performing a trim etch to sculpt/trim the fins in the area, before gates are deposited. In other embodiments, the principles and techniques as variously described herein may be used to sculpt/trim the entirety of fins in an opened area after depositing insulator material in the trenches between fins and then etching the insulator material to recess it below the top level of fins so as to expose the channel portion of the fins. In short, the fin trim process disclosed herein can be carried out at any number of locations in the transistor forming process, but sometime after the fins have incurred the process-induced changes to the channel region surface that are intended to be mitigated by the fin trim process, as will be appreciated.

Figure 4A:
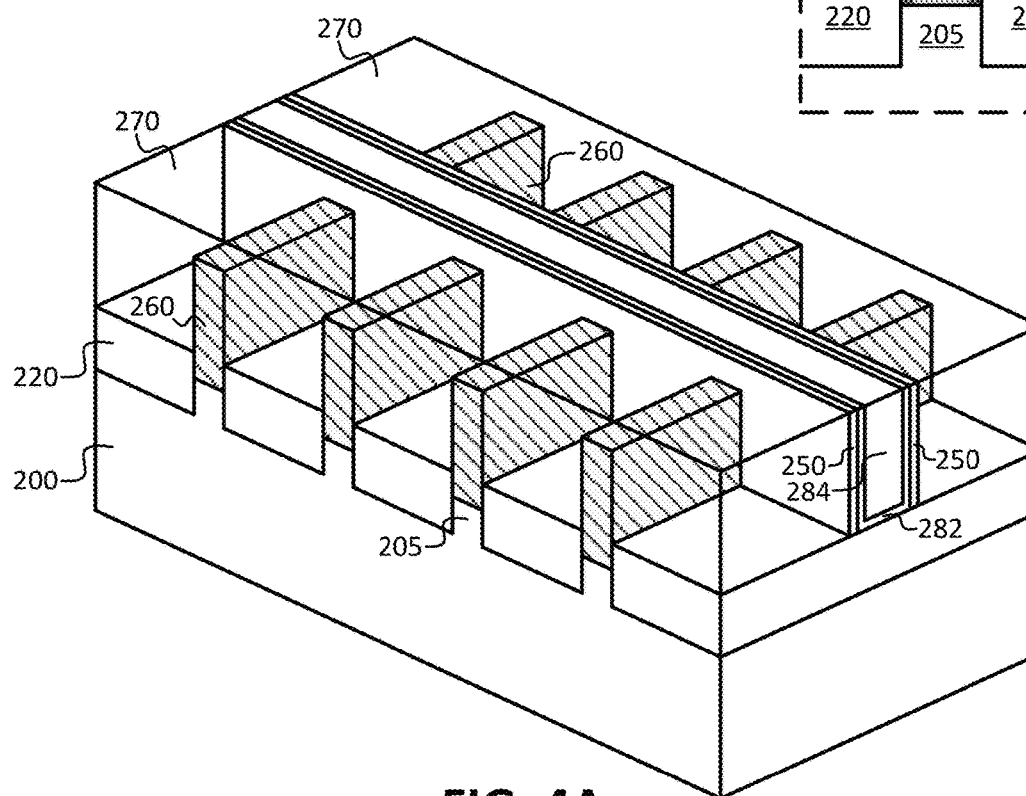

Method 100 of FIG. 1 continues with forming 116 the final gate structure on the exposed channel region, resulting in the example structure of FIG. 3C, in accordance with some embodiments. Note that FIG. 4A is a perspective view of the IC structure of FIG. 3C. As shown in FIGS. 3C and 4A, the final gate structure or stack includes gate dielectric 282 and gate dielectric 282, which may be formed using any suitable techniques. For example, the final gate stack may be formed using any of a wide variety of processes, including CVD, PVD, ALD, a metal deposition process, and/or any other suitable techniques. Recall that in some embodiments, the formation of the final gate stack, which includes gate dielectric 282 and gate electrode 284, may be performed using a gate first flow (also called up-front hi-k gate). In such embodiments, the final gate stack processing may have been alternatively performed at box 110, instead of forming a dummy gate stack. However, in this example embodiment, the final gate stack is formed using a gate last flow (also called a replacement gate or replacement metal gate (RMG) process). Regardless of whether gate first or gate last processing is employed, the final gate stack can include gate dielectric 282 and gate electrode 284 as shown in FIGS. 3C and 4A and described herein.

Gate dielectric 282, in some embodiments, may include any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, the gate dielectric 282 may include one or more silicates (e.g., titanium silicate, tungsten silicate, niobium silicate, and silicates of other transition metals). In some embodiments, an annealing process may be carried out on the gate dielectric 282 to improve its quality when high-k dielectric material is used. The gate electrode 284 may include a wide range of materials, such as various suitable metals or metal alloys, such as one or more of aluminum (Al), tungsten (W), titanium (Ti), tantalum (Ta), copper (Cu), or carbides and nitrides thereof, for example.

In some embodiments, gate dielectric 282 and/or gate electrode 284 may include a multilayer structure of two or more material layers, for example. For instance, in some embodiments, gate dielectric 282 may include a multilayer structure of at least two distinct layers, where the distinct layers are compositionally different. In some embodiments, gate dielectric 282 and/or gate electrode 284 may include grading (e.g., increasing and/or decreasing) the content/concentration of one or more materials in at least a portion of the feature(s). Additional layers may be present in the final gate stack, in some embodiments, such as one or more work-function layers or other suitable layers, for example.

Note that when the dummy gate is removed and the channel region is exposed, additional processing may occur as desired. Such processing of the channel region may include various different techniques, such as forming the material in the channel region into one or more nanowires for a gate-all-around (GAA) transistor configuration, for example. For instance, FIG. 3C' is a blown-out version of portion C-C from FIG. 3C, illustrating a gate-all-around (GAA) variation to the channel region structure, in accordance with some embodiments. As shown in FIG. 3C', the upper/channel region 213 of the Ge-containing layer 210 has been converted into nanowires 214 (specifically, two nanowires, in this example embodiment). In such an example embodiment, the original finned channel region may have included a multilayer structure, where one or more of the layers were sacrificial and selective etch processing is performed to remove those sacrificial layers and release the nanowires 214. As shown in FIG. 3C', two nanowires are provided, however, a nanowire or nanoribbon transistor (e.g., for GAA configurations) formed using the techniques disclosed herein may include any number of nanowires/nanoribbons such as 1, 3, 4, 5, 6, 7, 8, 9, 10, or more, depending on the desired configuration. In some embodiments, one or more of the nanowires or nanoribbon may be considered a physically separated upper portion of the fin, and thus, the previous relevant description with respect to upper/channel region 213 is equally applicable to nanowires 214. In embodiments employing one or more nanoribbons, those nanoribbons may have a height to width ratio as described for fins above, but inversed, such that a nanoribbon is similar to a sideways laying fin (e.g., with a width to height ratio of at least 1.5, 2, 2.5, 3, 4, or 5).

As can be understood based on this disclosure, the channel region is at least below the gate stack, in this example embodiment. For instance, in the case of a finned transistor configuration, the channel region may be below and between the gate stack, as the stack is formed on three sides as is known in the art. However, if the transistor device were inverted and bonded to what will be the end substrate, then the channel region may be above the gate. Therefore, in general, the gate structure and channel relationship may include a proximate relationship (which may or may not include one or more intervening gate dielectric layers and/or other suitable layers), where the gate is near the channel region such that it can exert control over the channel region in an electrical manner, in accordance with some embodiments. Further, in the case of a GAA transistor configuration), the gate stack may completely surround each nanowire/nanoribbon in the channel region (or at least substantially surround each nanowire, such as surrounding at least 70, 80, or 90% of each nanowire).

Method 100 of FIG. 1 continues with performing 118 S/D contact processing to form the example resulting structure of FIG. 4B, in accordance with some embodiments. As shown in FIG. 4B, S/D contacts 290 were formed to make contact to each of the S/D regions 260, in this example embodiment. In some embodiments, S/D contacts 290 may be formed using any suitable techniques, such as forming contact trenches in ILD layer 270 over the respective S/D regions 260 and depositing metal or metal alloy (or other suitable electrically conductive material) in the trenches. In some embodiments, S/D contact 290 formation may include silicidation, germanidation, III-V-idation, and/or annealing processes, for example. In some embodiments, one or more of the S/D contacts 290 may include a resistance reducing metal and a contact plug metal, or just a contact plug, for instance. Example contact resistance reducing metals include, for instance, nickel, titanium, titanium nitride, tantalum, tantalum nitride, cobalt, gold, gold-germanium, nickel-platinum, nickel aluminum, and/or other such resistance reducing metals or alloys. Example contact plug metals include, for instance, aluminum, tungsten, ruthenium, or cobalt, although any suitable conductive metal or alloy can be used. In some embodiments, additional layers may be present in the S/D contact 290 regions, such as adhesion layers (e.g., titanium nitride) and/or liner or barrier layers (e.g., tantalum nitride), if so desired. In some embodiments, a contact resistance reducing layer may be present between a given S/D region 260 and its corresponding S/D contact 290, such as a relatively highly doped intervening semiconductor material layer (e.g., with dopant concentrations greater than 1E18, 1E19, 1E20, 1E21, or 1E22 atoms per cubic cm), for example. In some such embodiments, the contact resistance reducing layer may include semiconductor material and/or impurity dopants based on the included material and/or dopant concentration of the corresponding S/D region, for example.

Method 100 of FIG. 1 continues with completing 120 integrated circuit (IC) processing as desired, in accordance with some embodiments. Such additional processing to complete the IC may include back-end or back-end-of-line (BEOL) processing to form one or more metallization layers and/or to interconnect the transistor devices formed during front-end or front-end-of-line (FEOL) processing, for example. Note that the processes 102-120 of method 100 are shown in a particular order for ease of description. However, one or more of the processes 102-120 may be performed in a different order or may not be performed at all. For example, box 102 is an optional process that need not be performed when fabricating planar transistor configurations. Numerous variations on method 100 and the techniques described herein will be apparent in light of this disclosure.

Use of the techniques and structures provided herein may be detectable using tools such as: electron microscopy including scanning/transmission electron microscopy (SEM/TEM), scanning transmission electron microscopy (STEM), nano-beam electron diffraction (NBD or to NBED), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments of the present disclosure, such tools may indicate the presence of transistors with upper/channel regions and lower/sub-channel regions with distinct compositions and dimensions, as variously described herein.

Example System

Figure 6:
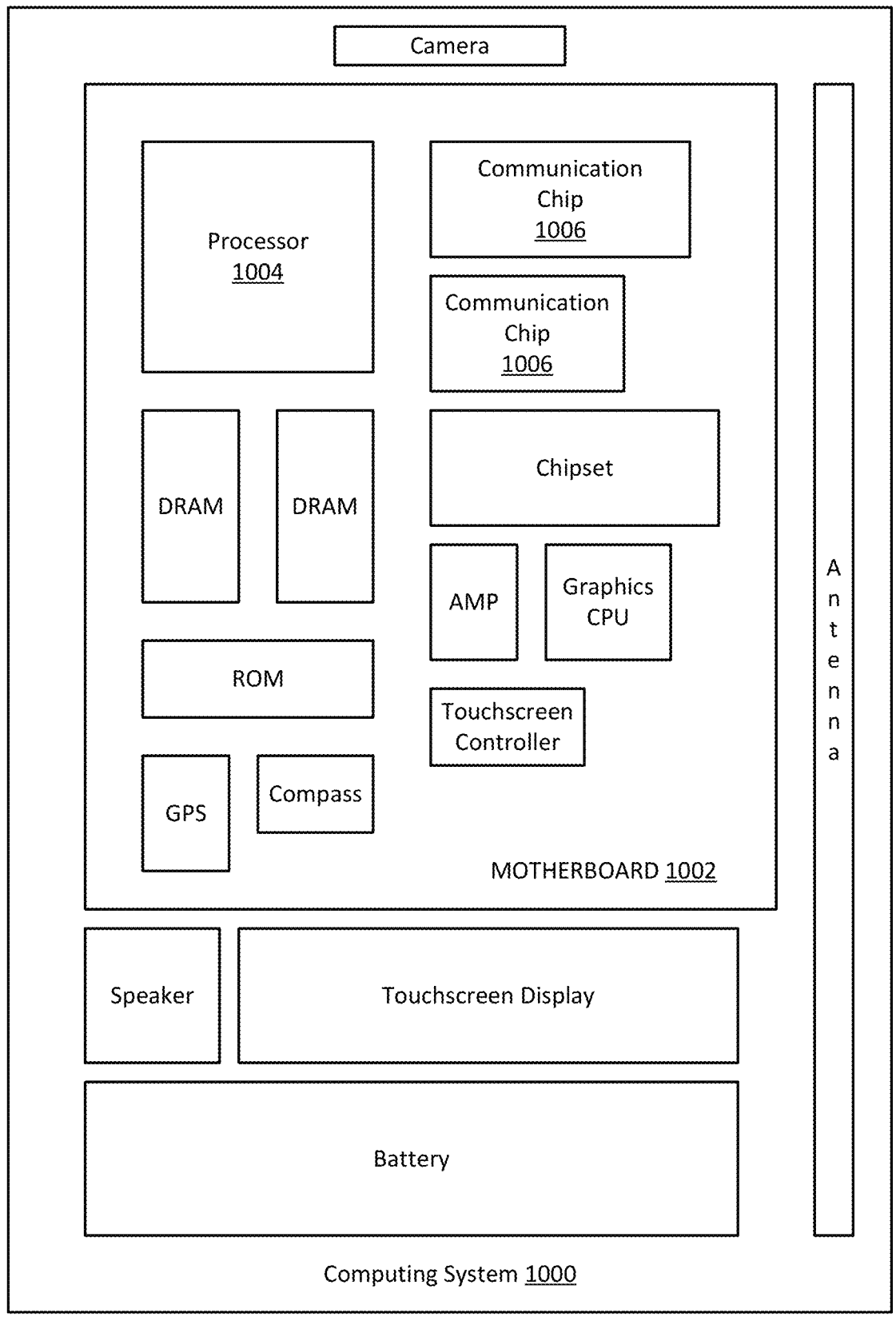
FIG. 6 illustrates a computing system implemented with one or more integrated circuits configured in accordance with one or more embodiments of the present disclosure.

FIG. 6 is an example computing system implemented with one or more of the integrated circuit structures as disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., read only memory (ROM)), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices configured in accordance with an example embodiment (e.g., to include one or more transistors with channel and sub-channel regions with distinct compositions and dimensions, as variously provided herein). In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (Institute of Electrical and Electronics Engineers (IEEE) 802.11 family), worldwide interoperability for microwave access (WiMAX) (IEEE 802.16 family), IEEE 802.20, long term evolution (LTE), 1× evolution-data optimized (Ev-DO), high speed packet access (HSPA+), high speed downlink packet access (HSDPA+), high speed uplink packet access (HSUPA+), enhanced data rates for GSM evolution (EDGE), global system for mobile communication (GSM), general packet radio service (GPRS), code division multiple access (CDMA), time division multiple access (TDMA), digital enhanced cordless telecommunications (DECT), Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others. In some embodiments, communication chip 1006 may include one or more transistor structures including transistors with channel and sub-channel regions with distinct compositions and dimensions, as variously described herein.

The processor 1004 of the computing system 1000 includes an integrated circuit die packaged within the processor 1004. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit (IC) including at least one transistor, the IC including: a gate structure including a gate electrode and a gate dielectric, the gate electrode including metal material; and a fin proximate the gate electrode, the gate dielectric between the gate electrode and the fin, the fin having an upper region that includes germanium and a lower region that includes germanium, the lower region having opposing sidewalls adjacent to and in contact with regions of insulator material, and the upper region having opposing sidewalls directly adjacent to and in contact with the gate dielectric, the lower region opposing sidewalls each having a first chemical composition and the upper region opposing sidewalls each having a second chemical composition different from the first chemical composition, the first chemical composition including one or more of oxygen, nitrogen, carbon, chlorine, fluorine, or sulfur; wherein a first width between the lower region opposing sidewalls at a first location is at least 1 nanometer (nm) wider than a second width between the upper region opposing sidewalls at a second location, the first location being within 10 nm of the second location.

Example 2 includes the subject matter of Example 1, further including a source region and a drain region, the upper region of the fin between the source and drain regions.

Example 3 includes the subject matter of Example 1 or 2, wherein the gate dielectric includes high-k dielectric material.

Example 4 includes the subject matter of any of Examples 1-3, wherein the first width is at least 5 nm wider than the second width.

Example 5 includes the subject matter of any of Examples 1-4, wherein the first width is at least 10 nm wider than the second width.

Example 6 includes the subject matter of any of Examples 1-5, wherein the first chemical composition includes at least 10 atomic percent more germanium than the second chemical composition.

Example 7 includes the subject matter of any of Examples 1-6, wherein the first chemical composition includes at least 20 atomic percent more germanium than the second chemical composition.

Example 8 includes the subject matter of any of Examples 1-7, wherein the first chemical composition includes at least 40 atomic percent germanium.

Example 9 includes the subject matter of any of Examples 1-8, wherein the lower region includes a bulk region between the lower region opposing sidewalls, the bulk region having a bulk chemical composition, the bulk chemical composition including a germanium concentration that is within 5 atomic percent of the germanium concentration of the second chemical composition.

Example 10 includes the subject matter of Example 9, wherein the first chemical composition includes at least 10 atomic percent more germanium than the bulk chemical composition.

Example 11 includes the subject matter of any of Examples 1-8, wherein the lower region includes a bulk region between the lower region opposing sidewalls, the bulk region having a bulk chemical composition, the bulk chemical composition including a germanium concentration that is at least 10 atomic percent higher than the germanium concentration of the second chemical composition.

Example 12 includes the subject matter of Example 11, wherein the first chemical composition includes at least 10 atomic percent more germanium than the bulk chemical composition.

Example 13 includes the subject matter any of Examples 1-12, wherein the one or more of oxygen, nitrogen, carbon, chlorine, fluorine, or sulfur are included in the first chemical composition in a surface concentration of the lower region opposing sidewalls of greater than 1E12 atoms per square centimeter.

Example 14 includes the subject matter of any of Examples 1-13, wherein the second chemical composition includes one or more of silicon, tin, indium, gallium, arsenic, and aluminum.

Example 15 includes the subject matter of any of Examples 1-14, wherein the first chemical composition extends from an outer surface of each of the lower region opposing sidewalls to a distance therebetween of 0.5 to 10 nm.

Example 16 includes the subject matter of any of Examples 1-15, wherein the upper region includes a nanowire such that the gate structure wraps around the nanowire.

Example 17 is a computing system including the subject matter of any of Examples 1-16.

Example 18 is an integrated circuit (IC) including at least one transistor, the IC including: a gate structure including a gate electrode and a gate dielectric, the gate electrode including metal material; a fin proximate the gate electrode, the gate dielectric between the gate electrode and the fin, the fin having an upper region that includes germanium and a lower region that includes germanium, the lower region having opposing sidewalls adjacent to and in contact with regions of insulator material, and the upper region having opposing sidewalls directly adjacent to and in contact with the gate dielectric, the lower region opposing sidewalls each having a first chemical composition and the upper region opposing sidewalls each having a second chemical composition, the first chemical composition having a relatively higher germanium concentration by atomic percent than the second chemical composition, the first chemical composition also including one or more of oxygen, nitrogen, carbon, chlorine, fluorine, or sulfur; and a source region and a drain region, the upper region of the fin between the source and drain regions; wherein a first width between the lower region opposing sidewalls at a first location is at least 1 nanometer (nm) wider than a second width between the upper region opposing sidewalls at a second location, the first location being within 10 nm of the second location.

Example 19 includes the subject matter of Example 18, wherein the gate dielectric includes high-k dielectric material.

Example 20 includes the subject matter of Example 18 or 19, wherein the first width is at least 5 nm wider than the second width.

Example 21 includes the subject matter of any of Examples 18-20, wherein the first width is at least 10 nm wider than the second width.

Example 22 includes the subject matter of any of Examples 18-21, wherein the first chemical composition includes at least 10 atomic percent more germanium than the second chemical composition.

Example 23 includes the subject matter of any of Examples 18-22, wherein the first chemical composition includes at least 20 atomic percent more germanium than the second chemical composition.

Example 24 includes the subject matter of any of Examples 18-23, wherein the first chemical composition includes at least 40 atomic percent germanium.

Example 25 includes the subject matter of any of Examples 18-24, wherein the lower region includes a bulk region between the lower region opposing sidewalls, the bulk region having a bulk chemical composition, the bulk chemical composition including a germanium concentration that is within 5 atomic percent of the germanium concentration of the second chemical composition.

Example 26 includes the subject matter of Example 25, wherein the first chemical composition includes at least 10 atomic percent more germanium than the bulk chemical composition.

Example 27 includes the subject matter of any of Examples 18-24, wherein the lower region includes a bulk region between the lower region opposing sidewalls, the bulk region having a bulk chemical composition, the bulk chemical composition including a germanium concentration that is at least 10 atomic percent higher than the germanium concentration of the second chemical composition.

Example 28 includes the subject matter of Example 27, wherein the first chemical composition includes at least 10 atomic percent more germanium than the bulk chemical composition.

Example 29 includes the subject matter of any of Examples 18-28, wherein the one or more of oxygen, nitrogen, carbon, chlorine, fluorine, or sulfur are included in the first chemical composition in a surface concentration of the lower region opposing sidewalls of greater than 1E12 atoms per square centimeter.

Example 30 includes the subject matter of any of Examples 18-29, wherein the second chemical composition includes one or more of silicon, tin, indium, gallium, arsenic, and aluminum.

Example 31 includes the subject matter of any of Examples 18-30, wherein the first chemical composition extends from an outer surface of each of the lower region opposing sidewalls to a distance therebetween of 0.5 to 10 nm.

Example 32 includes the subject matter of any of Examples 18-31, wherein the upper region includes a nanowire such that the gate structure wraps around the nanowire.

Example 33 is a mobile computing system including the subject matter of any of Examples 18-32.

Example 34 is a method of forming an integrated circuit (IC) including at least one transistor, the method including: forming a fin having an upper region that includes germanium and a lower region that includes germanium, the lower region having opposing sidewalls adjacent to and in contact with regions of insulator material, and the upper region having opposing sidewalls, the lower region opposing sidewalls each having a first chemical composition and the upper region opposing sidewalls each having a second chemical composition different from the first chemical composition, the first chemical composition including one or more of oxygen, nitrogen, carbon, chlorine, fluorine, or sulfur; and forming a gate structure proximate the fin, the gate structure including a gate electrode and a gate dielectric, the gate electrode including metal material, the gate dielectric between the gate electrode and the fin, the upper region opposing sidewalls directly adjacent to and in contact with the gate dielectric; wherein a first width between the lower region opposing sidewalls at a first location is at least 1 nanometer (nm) wider than a second width between the upper region opposing sidewalls at a second location, the first location being within 10 nm of the second location.

Example 35 includes the subject matter of Example 34, wherein forming the fin includes performing a trim etch to reduce the width between the upper region opposing sidewalls to the second width.

Example 36 includes the subject matter of Example 35, wherein the trim etch includes a plasma assisted etch process utilizing etching gases containing one or more of chlorine, fluorine, nitrogen, argon, hydrogen, helium, carbon, oxygen, sulfur, and xenon.

Example 37 includes the subject matter of Example 35 or 36, wherein the trim etch includes operating temperatures in the range of 15 to 400 degrees Celsius.

Example 38 includes the subject matter of any of Examples 34-37, wherein the fin is formed via blanket depositing the material of the fin and then shaping the blanket deposited material into the fin.

Example 39 includes the subject matter of any of Examples 34-37, wherein the fin is formed via depositing the material of the fin in a fin-shaped trench between the insulator material.

Example 40 includes the subject matter of any of Examples 34-39, further including forming a source region and a drain region, the upper region of the fin between the source and drain regions.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) including at least one transistor, the IC comprising:
    a gate structure including a gate electrode and a gate dielectric, the gate electrode including metal material; and
    a fin proximate the gate electrode, the gate dielectric between the gate electrode and the fin, the fin having an upper region that includes germanium and a lower region that includes germanium, the lower region having opposing sidewalls adjacent to and in contact with regions of insulator material, and the upper region having opposing sidewalls directly adjacent to and in contact with the gate dielectric, the lower region opposing sidewalls each having a first chemical composition and the upper region opposing sidewalls each having a second chemical composition different from the first chemical composition, the first chemical composition including one or more of oxygen, nitrogen, carbon, chlorine, fluorine, or sulfur;
    wherein a first width between the lower region opposing sidewalls at a first location is at least 1 nanometer (nm) wider than a second width between the upper region opposing sidewalls at a second location, the first location being within 10 nm of the second location.

2. The IC of claim 1, further comprising a source region and a drain region, the upper region of the fin between the source and drain regions.

3. The IC of claim 1, wherein the gate dielectric includes high-k dielectric material.

4. The IC of claim 1, wherein the first width is at least 5 nm wider than the second width.

5. The IC of claim 1, wherein the first chemical composition includes at least 10 atomic percent more germanium than the second chemical composition.

6. The IC of claim 1, wherein the first chemical composition includes at least 20 atomic percent more germanium than the second chemical composition.

7. The IC of claim 1, wherein the lower region includes a bulk region between the lower region opposing sidewalls, the bulk region having a bulk chemical composition, the bulk chemical composition including a germanium concentration that is within 5 atomic percent of the germanium concentration of the second chemical composition.

8. The IC of claim 1, wherein the lower region includes a bulk region between the lower region opposing sidewalls, the bulk region having a bulk chemical composition, the bulk chemical composition including a germanium concentration that is at least 10 atomic percent higher than the germanium concentration of the second chemical composition.

9. The IC of claim 1, wherein the one or more of oxygen, nitrogen, carbon, chlorine, fluorine, or sulfur are included in the first chemical composition in a surface concentration of the lower region opposing sidewalls of greater than 1E12 atoms per square centimeter.

10. The IC of claim 1, wherein the second chemical composition includes one or more of silicon, tin, indium, gallium, arsenic, and aluminum.

11. The IC of claim 1, wherein the first chemical composition extends from an outer surface of each of the lower region opposing sidewalls to a distance therebetween of 0.5 to 10 nm.

12. The IC of claim 1, wherein the upper region includes a nanowire such that the gate structure wraps around the nanowire.

13. An integrated circuit (IC) including at least one transistor, the IC comprising:
- a gate structure including a gate electrode and a gate dielectric, the gate electrode including metal material;
- a fin proximate the gate electrode, the gate dielectric between the gate electrode and the fin, the fin having an upper region that includes germanium and a lower region that includes germanium, the lower region having opposing sidewalls adjacent to and in contact with regions of insulator material, and the upper region having opposing sidewalls directly adjacent to and in contact with the gate dielectric, the lower region opposing sidewalls each having a first chemical composition and the upper region opposing sidewalls each having a second chemical composition, the first chemical composition having a relatively higher germanium concentration by atomic percent than the second chemical composition, the first chemical composition also including one or more of oxygen, nitrogen, carbon, chlorine, fluorine, or sulfur; and
- a source region and a drain region, the upper region of the fin between the source and drain regions;
- wherein a first width between the lower region opposing sidewalls at a first location is at least 1 nanometer (nm) wider than a second width between the upper region opposing sidewalls at a second location, the first location being within 10 nm of the second location.

14. The IC of claim 13, wherein the first width is at least 10 nm wider than the second width.

15. The IC of claim 13, wherein the first chemical composition includes at least 20 atomic percent more germanium than the second chemical composition.

16. The IC of claim 13, wherein the one or more of oxygen, nitrogen, carbon, chlorine, fluorine, or sulfur are included in the first chemical composition in a surface concentration of the lower region opposing sidewalls of greater than 1E12 atoms per square centimeter.

17. The IC of claim 13, wherein the upper region includes a nanowire such that the gate structure wraps around the nanowire.

18. A method of forming an integrated circuit (IC) including at least one transistor, the method comprising:
- forming a fin having an upper region that includes germanium and a lower region that includes germanium, the lower region having opposing sidewalls adjacent to and in contact with regions of insulator material, and the upper region having opposing sidewalls, the lower region opposing sidewalls each having a first chemical composition and the upper region opposing sidewalls each having a second chemical composition different from the first chemical composition, the first chemical composition including one or more of oxygen, nitrogen, carbon, chlorine, fluorine, or sulfur; and
- forming a gate structure proximate the fin, the gate structure including a gate electrode and a gate dielectric, the gate electrode including metal material, the gate dielectric between the gate electrode and the fin, the upper region opposing sidewalls directly adjacent to and in contact with the gate dielectric;
- wherein a first width between the lower region opposing sidewalls at a first location is at least 1 nanometer (nm) wider than a second width between the upper region opposing sidewalls at a second location, the first location being within 10 nm of the second location.

19. The method of claim 18, wherein forming the fin includes performing a trim etch to reduce the width between the upper region opposing sidewalls to the second width.

20. The method of claim 19, wherein the trim etch includes a plasma assisted etch process utilizing etching gases containing one or more of chlorine, fluorine, nitrogen, argon, hydrogen, helium, carbon, oxygen, sulfur, and xenon.

* * * * *